United States Patent [19]

Fagan

[11] 4,085,441

[45] Apr. 18, 1978

[54] MONOLITHIC IMPLEMENTATION OF A FAST FOURIER TRANSFORM

[75] Inventor: John L. Fagan, Pasadena, Md.

[73] Assignee: Westinghouse Electric Corporation, Pittsburgh, Pa.

[21] Appl. No.: 744,546

[22] Filed: Nov. 24, 1976

[51] Int. Cl.[2] ...................... G11C 11/40; H03K 5/159

[52] U.S. Cl. ................................ 364/827; 307/221 D; 328/167; 364/825; 364/862

[58] Field of Search ............................... 235/193, 181; 307/221 D, 221 C; 328/167; 333/70 T, 18, 28; 357/24; 340/173 R, 173 RC

[56] References Cited

U.S. PATENT DOCUMENTS

| | | | |
|---|---|---|---|
| 3,931,510 | 1/1976 | Kmetz | 235/193 |
| 3,942,035 | 3/1976 | Buss | 307/221 D |
| 3,952,188 | 4/1976 | Sloate et al. | 235/193 |
| 3,979,582 | 9/1976 | Mims | 235/193 |
| 3,987,292 | 10/1976 | Means | 235/193 X |
| 3,987,293 | 10/1976 | Crooke et al. | 235/193 |

*Primary Examiner*—Joseph F. Ruggiero
*Attorney, Agent, or Firm*—R. M. Trepp

[57] ABSTRACT

An improved discrete analog filter incorporating analog delay and successive arithmetic stages utilizing charge coupled devices is described which may accept an analog input signal and calculate with the arithmetic stages the fast Fourier transform of the analog input signal to provide output signals indicative of the Fourier coefficients of the input signal.

16 Claims, 8 Drawing Figures

| DATA SIGNAL | 1ST ARITHMETIC STAGE | 2ND ARITHMETIC STAGE | 3RD ARITHMETIC STAGE |
|---|---|---|---|
| $f_0$ | $X_0 = f_0 + f_4$ | $Y_0 = X_0 + X_1$ | $F_0 = Y_0 + Y_1$ |
| $f_1$ | $X_1 = f_2 + f_6$ | $Y_1 = X_2 + X_3$ | $F_1 = Y_2 + Y_3 W$ |
| $f_2$ | $X_2 = f_1 + f_5$ | $Y_2 = X_4 + X_5 W^2$ | $F_2 = Y_4 + Y_5 W^2$ |
| $f_3$ | $X_3 = f_3 + f_7$ | $Y_3 = X_6 + X_7 W^2$ | $F_3 = Y_6 + Y_7 W^3$ |
| $f_4$ | $X_4 = f_0 - f_4$ | $Y_4 = X_0 - X_1$ | $F_4 = Y_0 - Y_1$ |
| $f_5$ | $X_5 = f_2 - f_6$ | $Y_5 = X_2 - X_3$ | $F_5 = Y_2 - Y_3 W$ |
| $f_6$ | $X_6 = f_1 - f_5$ | $Y_6 = X_4 - X_5 W^2$ | $F_6 = Y_4 - Y_5 W^2$ |
| $f_7$ | $X_7 = f_3 - f_7$ | $Y_7 = X_6 - X_7 W^2$ | $F_7 = Y_6 - Y_7 W^3$ |

MONOLITHIC IMPLEMENTATION OF A FAST FOURIER TRANSFORM

BACKGROUND OF THE INVENTION

1. Field of the Invention

This invention relates to analog filters and more particularly to apparatus for calculating the fast Fourier transform of an analog input signal utilizing charge coupled devices.

2. Description of the Prior Art

In the prior art, the discrete Fourier transform of an analog input signal was performed by sampling the analog input signal with a sample and hold circuit, converting the analog voltage samples into digital numbers with an analog-to-digital converter and with a predetermined number of samples performing numerous additions, subtractions and multiplications by a digital processor to derive digital numbers indicative of the Fourier coefficients of the analog input signal. By placing a constraint on the sample size, such that it is a power of two, the number of additions, subtractions and multiplications may be drastically reduced by using the fast Fourier transform to perform the discrete Fourier transform. The primary disadvantage of the discrete Fourier transform and even the fast Fourier transform is that they require A to D converters, digital processing equipment to perform the numerous calculations and digital storage to hold intermediate data until the final result is obtained. Nevertheless, the desirability of performing the fast Fourier transform from a signal processing standpoint is so great that hardware to perform the fast Fourier transform has been built for many applications using both special and general purpose digital processors.

The fast Fourier transform can be performed using analog adders, subtractors and multipliers in place of digital adders, subtractors and multipliers but heretofore have not because of the precision circuits required and the difficulty in storing analog voltages. These difficulties may however be circumvented by using charge transfer devices (CTD's) or change coupled devices (CCD's) where analog storage of analog signals is easily incorporated.

It is therefore desirable to perform the discrete Fourier transform or fast Fourier transform utilizing discrete analog signals to eliminate analog-to-digital converters and digital signal processing equipment. Furthermore, it is desirable to build similarly structured arithmetic stages which may be incorporated in monolithic or integrated circuit form for low cost and to serve as building blocks for larger systems.

SUMMARY OF THE INVENTION

In accordance with the present invention apparatus is provided for realizing a fast Fourier transform of an analog input signal comprising means for sampling an analog input signal to form a plurality of time spaced discrete analog data signals, means for reordering the discrete analog data signals to provide a sequence of predetermined pairs of discrete analog data signals to a first arithmetic stage, the first arithmetic stage incorporates charge coupled devices for arithmetically combining predetermined pairs of discrete analog data signals to form a first and second discrete analog output signal, a second arithmetic stage incorporates charge coupled devices for arithmetically combining successive pairs of the first discrete analog output signal to form a third and fourth discrete analog output signal, means for weighting the second discrete analog output signal in accordance with predetermined values and charge coupled devices for arithmetically combining successive pairs of the weighted second discrete analog output signal to form a fifth and sixth discrete analog output signal, and a third arithmetic stage incorporating charge coupled devices for arithmetically combining successive pairs of the third, fourth, fifth and sixth discrete analog output signals to form the seventh through fourteenth discrete analog output signals having values indicative of the Fourier coefficients of the fast fourier transform of the analog input signal.

The present invention further provides a circuit for performing analog arithmetic calculations for use in realizing a fast Fourier transform of an analog input signal comprising an input for analog signals, means for multiplying the input analog signals by one of a plurality of predetermined numbers to generate a first signal, a first charge coupled device coupled to the means for multiplying and includes a channel suitable for charge, means for injecting charge into the channel proportional to the first signal, means for isolating the charge in the channel from the means for injecting charge, means for collecting charge from the means for injecting charge and the means for isolating charge including means for generating a second signal proportional to the charge collected by the means for collecting charge, means for amplifying the second signal to maintain unity signal gain through the charge coupled device, means coupled to the first charge coupled device for removing charge collected by the means for collecting charge, a second charge coupled device coupled to the means for multiplying and coupled to the means for amplifying including a second channel suitable for charge, second means for injecting charge into the second channel proportional to the output of the means for amplifying, means for separating a portion of charge injected by the second means for injecting charge corresponding to the difference of the present first signal and the aplified second signal, second means for collecting the portion of charge from the means for separating including means for generating a third signal proportional to the charge collected by the second means for collecting charge, second means for amplifying the third signal to maintain unity gain through the second charge coupled device, and means coupled to the second charge coupled device for removing charge collected by the second means for collecting the portion of charge.

DESCRIPTION OF THE PREFERRED EMBODIMENTS

The discrete Fourier transform for a sample analog input signal is given by equation (1) for a sequence of N samples.

$$F(K\Omega) = \sum_{n=0}^{N-1} f(nT)e^{-j\Omega TnK} \quad (1)$$

Figures 1, 2:
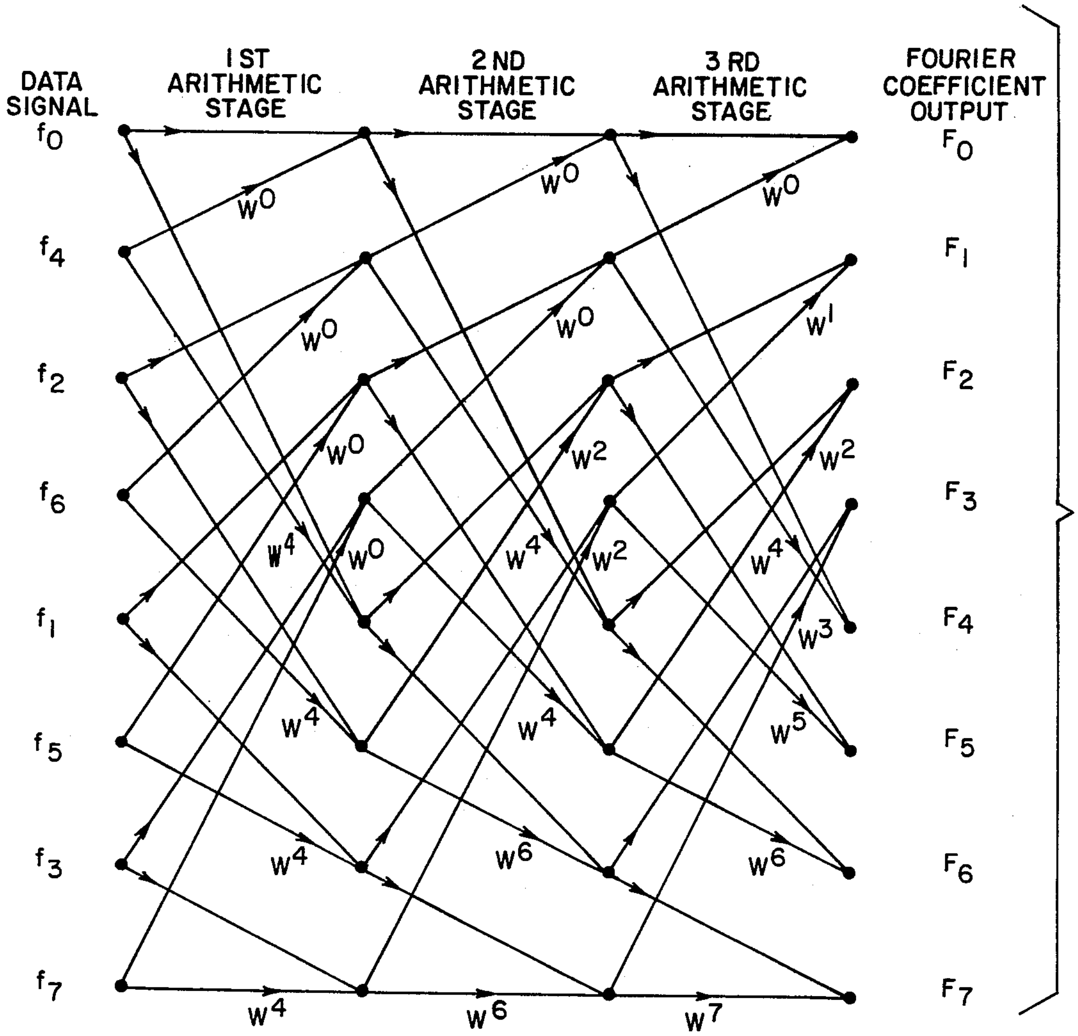
FIG. 1 is a data flow graph of an 8-point fast Fourier transform with identical stages.
FIG. 2 is a graph depicting the calculations for each stage shown in FIG. 1.

In equation (1), T is the sampling period and $n$ is an integer between 0 and N-1. Evaluation of equation (1) requires $N^2$ complex multiplications. The fast Fourier transform (FFT) is an algorithm for reducing the number of calculations by elimination of redundant and non-contributing terms. When N is a power of two, the number of calculations required is proportional to N $\log_2$ N, a substantial savings if N is large. An example of the data flow of an 8-point fast Fourier transform (FFT) is shown in FIG. 1. The discrete analog input signals obtained by sampling the input analog signal is represented along the left ordinate by $f_0$ through $f_7$ where the subscript of $f$, 0 through 7, represents the order in time when the sample was taken. FIG. 1 shows the data flowing from left-to-right to a first arithmetic stage. The W beside the lines going from the discrete analog input signals to the first arithmetic stage represent the weighting function. The discrete analog input signals are multipled by the respective weighting function. FIG. 2 shows the arithmetic calculations performed by the first, second and third arithmetic stages to perform an 8-point FFT in accordance with the data flow in FIG. 1. In FIGS. 1 and 2 the weighting function W represents the mathematical term shown in equation (2).

$$W = e^{-j2\pi/N} \quad (2)$$

In accordance with equation (2), mathematically, $W^0 = 1$, $W^4 = -1$, $W^5 = -W^1$, $W^6 = -W^2$ and $W^7 = -W^3$. Therefore the weights, W terms, are constants whose values are always between $-1$ and $+1$ and depend only on the number of samples N.

For a more detailed discussion of the discrete Fourier transform and the fast Fourier transform reference is made to B. Gold and C. M. Rader, Digital Processing of Signals, Chapter 6, McGraw-Hill, New York, 1969, which is incorporated by reference herein.

Figure 3:
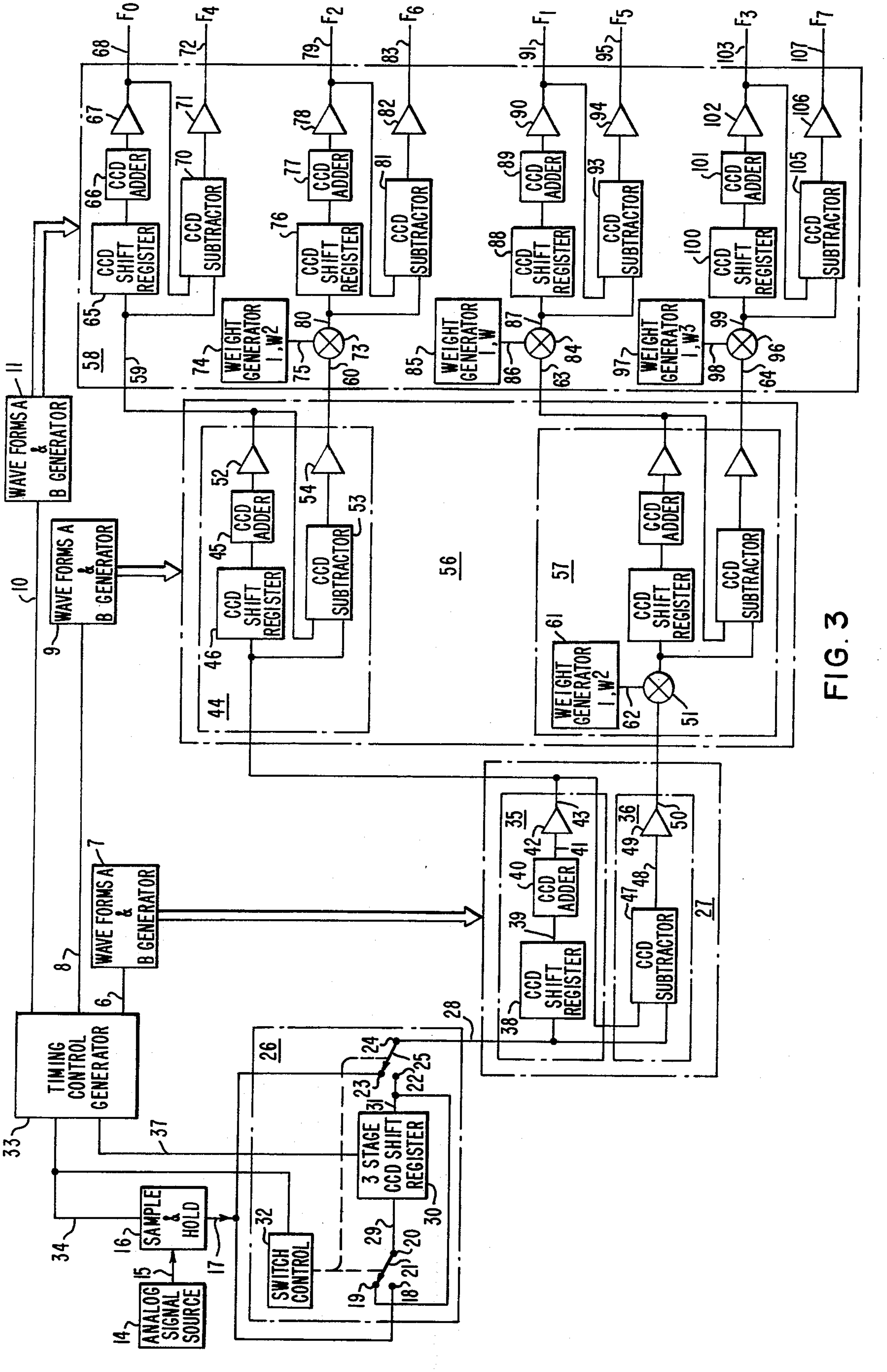
FIG. 3 is one embodiment of the invention.

Referring now to FIG. 3 an embodiment of the invention is shown which performs the calculations in accordance with a predetermined data flow shown by FIGS. 1 and 2. Analog signal source 14 has an output over line 15 which represents an analog input signal having a time function $f(t)$. Sample and hold circuit 16 samples the analog input signal on line 15 and generates a sequence of N samples $f(n\text{T})$ where T is the sampling interval in the time domain. The sequence of N samples is fed over line 17 to sequence recorder loop 26 and more specifically to terminal 18 of switch 21 and terminal 23 of switch 25. Reorder loop 26 functions to reorder the discrete analog data signals to provide a sequence of predetermined pairs of discrete analog data signals to the input of the first arithmetic stage 27 over line 28. Terminal 20 of switch 21 is coupled over line 29 to an input of shift register 30. Shift register 30 functions to store certain discrete analog data signals which is fed in by switch 21 and stored in shift register 30 for three time delays or three discrete analog data signal time periods. The output of shift register 30 is coupled over line 31 to terminal 22 of switch 25 and terminal 19 of switch 21. Shift register 30 functions to store predetermined discrete analog data signals for reordering the discrete analog data signals presented to the first arithmetic stage. Terminal 24 of switch 25 is coupled to line 28 which carries the reordered sequence of discrete analog data signals to the first arithmetic stage 27. Switches 21 and 25 as shown in FIG. 3 are single pole double throw switches controlled by switch control 32. Switch 21 is in position 1 when terminal 20 is connected to terminal 18 and in position 2 when terminal 20 is connected to terminal 19. Switch 25 is in position 1 when terminal 24 is connected to terminal 22 and in position 2 when terminal 24 is connected to terminal 23. As shown in FIG. 3 switches 21 and 25 are in position number 2. Under control of switch control 32 switches 21 and 25 may be moved together from position 2 to position 1 and back to position 2 under a switch control sequence. In accordance with FIG. 1 the desired sequence of timed samples shown on the left side of FIG. 1 running from top to bottom is $f_0$, $f_4$, $f_2$, $f_6$, $f_1$, $f_5$, $f_3$, and $f_7$. In order to obtain the following sequence utilizing reorder loop 26 switch control 32 should have the following sequence of switch positions for switches 21 and 25 which should operate at the rate of the sample and hold circuit 16, the source of discrete analog data signals. The timing for the three stage shift register 30 should also operate at the same rate as the sample and hold circuit 16 and switch control 32 to provide timely movement of the data through shift register 30 and switches 21 and 25. The sequence for switch positions for switches 21 and 25 to reorder the discrete analog data signals in accordance with FIG. 1 is 1, 1, 1, 1, 2, 1, 2, and 1 which should be repeated over and over to generate repeated 8-point data samples which are reordered.

Switch control 32 may, for example, include a counter and decoding logic to provide the sequence of switch positions to control switches 21 and 25 which is conventional in the art. Switches 21 and 25 may, for example be field effect transistors controlled by electrical signals. The timing pulses or clock for sample and hold circuit 16 switch control 32 is supplied over line 34 by timing control generator 33 in accordance with the signal timing in FIG. 8. The timing pulses or clock for shift register 30 which may for example be a charge coupled device is supplied over line 37 which may, for example, be a 1, 2 or 4 phase clock. The data signals on lines 15, 17 and 28 as a function of time are shown in FIG. 8 (at the top).

Figure 8:
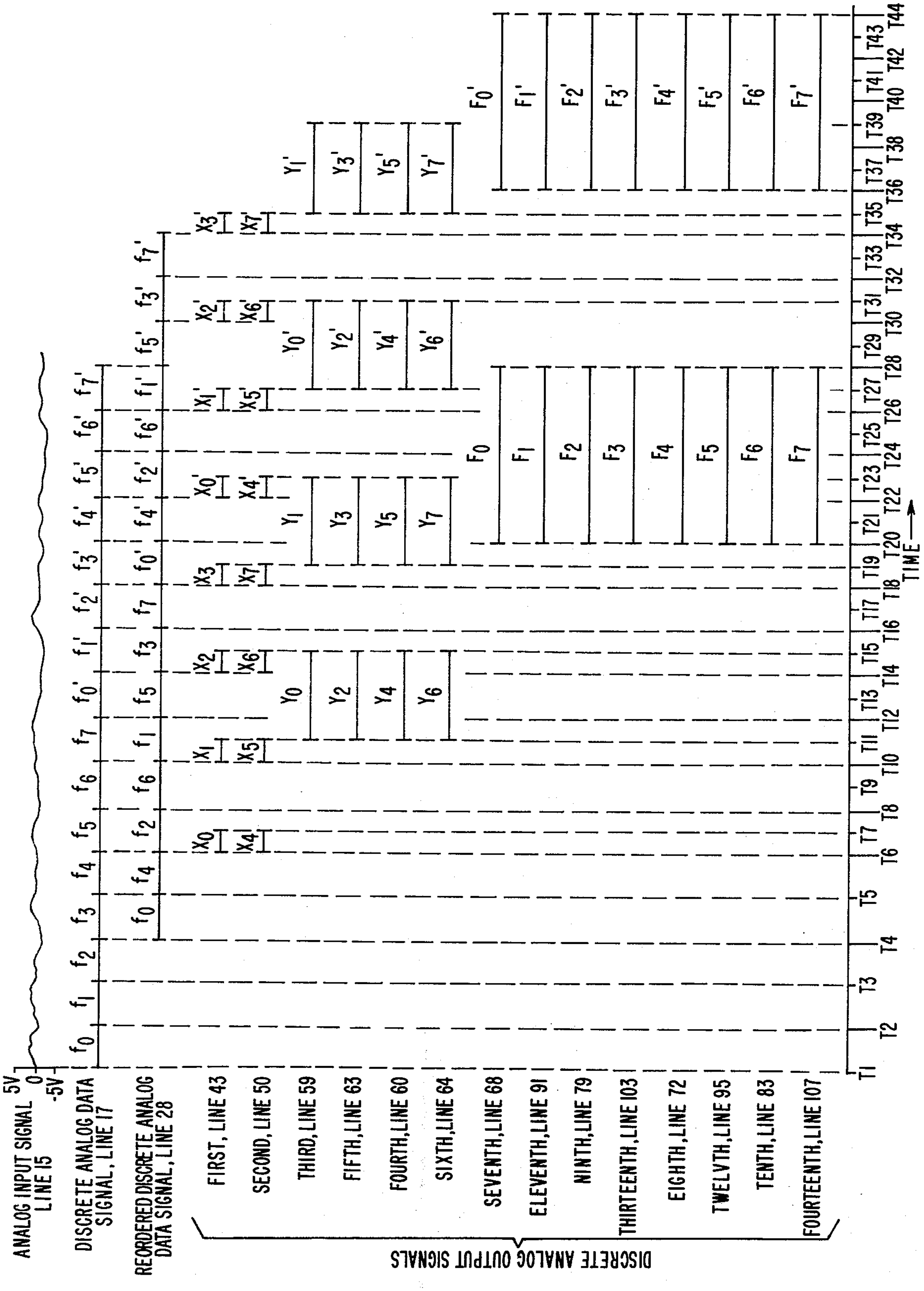
FIG. 8 shows the timing for the occurrence of data in response to the operation of the embodiment in FIG. 3 utilizing the timing shown in FIGS. 6 and 7.

During startup, $f_0$ will not appear for the start of an 8-point sequence until the fourth clock time in the switch position sequence as shown in FIG. 8.

Figure 6:
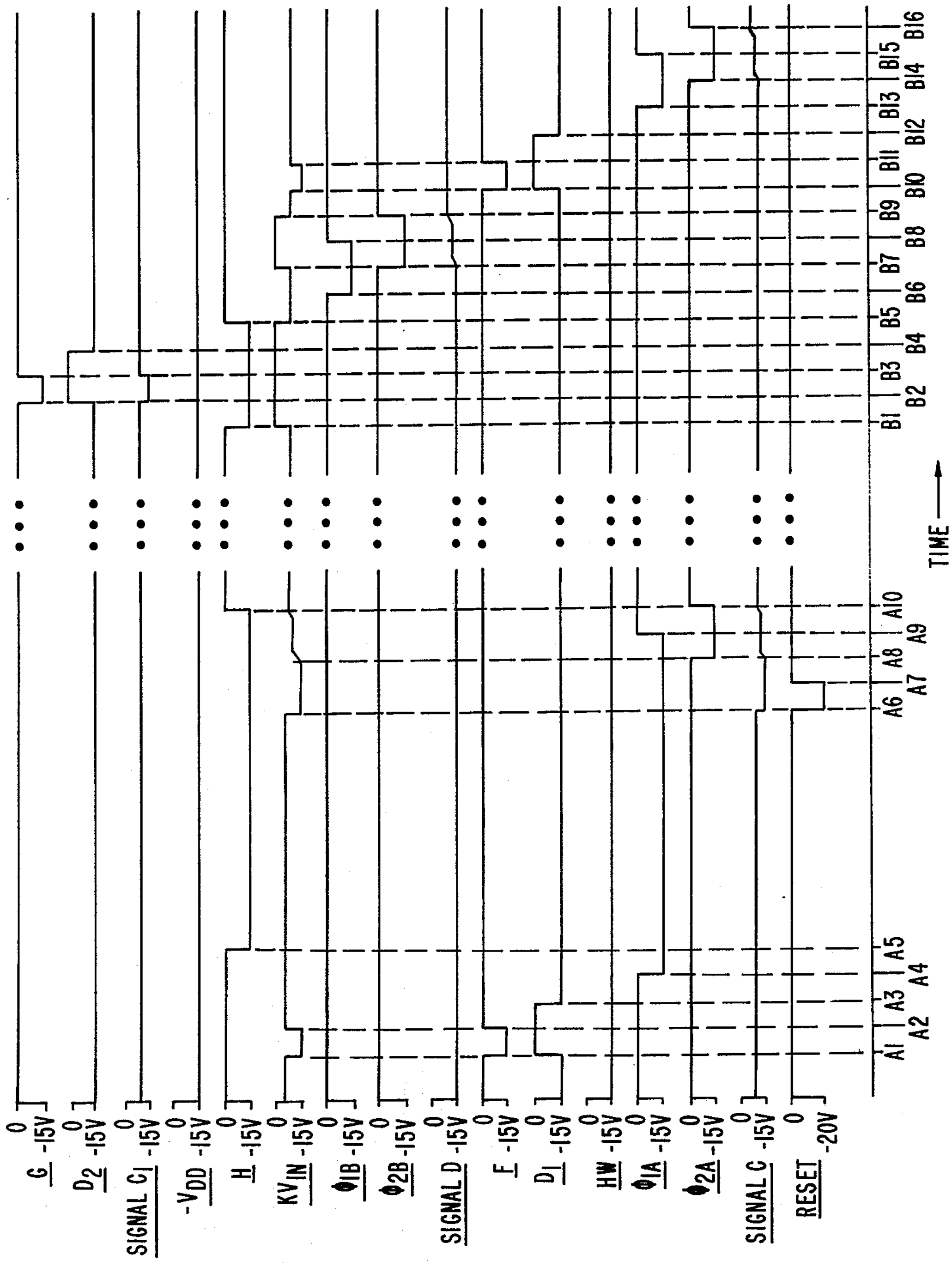
FIG. 6 shows typical waveforms for the circuit of FIG. 5.

Timing control generator 33 is coupled over line 6 to waveforms A and B generator 7, over line 8 to waveforms A and B generator 9, and over line 10 to waveforms A and B generator 11. Timing and control generator 33 functions to provide control signals to waveforms A and B generators 7, 9 and 11 to initiate waveforms A or waveforms B to their respective arithmetic stages 27, 56, and 58 in accordance with the timing shown in FIG. 7. Waveforms A and B generator 7, 9, and 11 function to provide its respective arithmetic stage control signal waveforms as shown in FIG. 6, to be explained in more detail subsequently. Waveforms A and B generator 7, 9, and 11 may be, for example, a read only memory having a predetermined storage pattern and an address generator to provide waveforms on each bit line by addressing a sequence of words in the memory. Timing control generator 33 may include, for example, an oscillator, counters, decoding logic, control logic, and driver circuits to provide signals on lines 6, 8, 10, 34 and 37.

The first arithmetic stage 27 as shown in FIG. 3 functions to perform mathematical or algebraic calculations and includes an adder 35 and an subtractor 36. Adder 35 functions to add two values or discrete analog data signals or a pair of numbers in a sequence on line 28 together while subtractor 36 functions to subtract two discrete analog data signals on line 28 or a pair of numbers, one from the other, in a serial sequence. The additions and subtractions to be performed by the first arithmetic stage 27 may be shown by reference to FIG. 2 wherein the first arithmetic stage operations are shown as $X_0$ through $X_7$. The data occurring as a function of time on lines 28, 43 and 50, the input and outputs of the first arithmetic stage 27 is shown in FIG. 8. When the first two discrete analog data samples are fed to the first arithmetic stage 27 the samples $f_0$ and $f_4$ will be added together by the adder 35 to provide $X_0$ and subtracted in the subtractor 36 to provide $X_4$. The next two discrete analog data signals in the sequence $f_2$ and $f_6$ will be added in adder 35 to yield $X_1$ and subtracted in subtractor 36 to yield $X_5$. The next two discrete analog signals in the sequence, $f_1$ and $f_5$ will likewise be added in adder 35 and subtracted in subtractor 36 to yield $X_2$ and $X_6$, respectively. The last two discrete analog data signals in the sequence $f_3$ and $f_7$ will be added together in adder 35 and subtracted in subtractor 36 to provide $X_3$ and $X_7$, respectively.

Adder 35 includes CCD shift register 38 having an input on line 28 and having an output coupled over line 39 to an input of CCD adder 40 the output of CCD adder 40 is coupled over line 41 to amplifier 42. The output of amplifier 42 which is designated as the first discrete analog output signal is coupled over line 43 to an input of CCD subtractor 47 and to an input of arithmetic circuit 44 of the second arithmetic stage 56.

Subtractor 36 includes CCD subtractor 47 having a first and second input coupled over lines 28 and 43 respectively. The output of CCD subtractor is coupled over line 48 to an input of amplifier 49. The output of amplifier 49 is coupled over line 50 to an input of multiplier 51 of the second arithmetic stage. The output of subtractor 36 over line 50 is designated as the second discrete analog output signal. Amplifiers 42 and 49 function to provide unity signal gain through the first arithmetic stage 27 since some signal loss may be experienced by converting from voltages to charge packets for representation of signals and then from charge packets back to voltages. The CCD shift register 38 and CCD adder 40 function together as an adder in CCD technology. CCD subtractor 47 functions as a subtractor utilizing CCD technology for two input signals on lines 28 and 43. As will be further explained the output of the subtractor 36 will be 0 or a clamped value for the case when the absolute value of B on line 28 is greater than the value of A on line 43. Subtractor 36 will express a value at the output when the absolute value of B on line 28 is less than the value of A on line 43. The result of setting values to 0 at the output of subtractor 36 when B is greater than A does not interfere with the subsequent arithmetic calculations shown in FIG. 2 to arrive at the Fourier coefficients. The output of the first arithmetic stage 27 on lines 43 and 50 is at the rate of one-half the input data since two input discrete analog data signals such as $f_0$ and $f_4$, or a pair of signals are arithmetically or algebraically combined to provide one discrete analog output signal on each of output lines 43 and 50 from the first arithmetic stage 27.

The second arithmetic stage 56 includes arithmetic circuit 44 and arithmetic circuit 57. Arithmetic circuit 44 is identical in structure to the first arithmetic stage 27. The input on line 43 is coupled to an input of CCD adder 45 through CCD shift register 46. The output of adder 45 is coupled through amplifier 52 to an input of the third arithmetic stage 58 over line 59 having a signal designated as the third discrete analog output signal. The output of the CCD subtractor 53 in arithmetic circuit 44 is coupled through amplifier 54 to an input of the third arithmetic stage 58 over line 60 having a signal designated as the fourth discrete analog output signal. Arithmetic circuit 57 is identical to arithmetic circuit 27 except for the addition of multiplier 51 with an input and an output coupled in series with the input signal on line 50 and weight generator 61 coupled over line 62 to a second input of multiplier 51. Weight generator 61 functions to multiply the input signal by the value 1 or $W^2$ which for an 8-point FFT equals $e^{-j\pi/2}$. The multiplication can be achieved by switching in a resistor divider which may attenuate the input signal according to $W^2$. Generator 61 therefore has a weight sequence which is at the same rate as the output signal from the first arithmetic stage 27 of 1, $W^2$, 1, $W^2$ which is repeated for each 8-point FFT where the sequence is started on the term $X^4$ shown in FIGS. 2 and 8. One output of the second arithmetic stage 56 from arithmetic circuit 57 is the fifth discrete analog output signal coupled over line 63 to the third arithmetic stage 58. A second output of the second arithmetic stage 56 from arithmetic circuit 57 is coupled over line 64 to the third arithmetic stage 58 which is designated the sixth discrete analog output signal. Each output of the second arithmetic stage 56, the third, fourth, fifth and sixth discrete analog output signals, is at one-half the data rate of the first arithmetic stage 27 since one discrete analog output signal on each of the output lines 59, 60, 63 and 64 from the second arithmetic stage 56 is formed by mathematically or algebraically combining two successive discrete analog output signals from the first arithmetic stage 27.

The third arithmetic stage 58 performs the mathematical calculations upon the input signals $Y_0$ through $Y_7$ to generate the output signals $F_0$ through $F_7$ shown in FIGS. 2 and 8. More specifically, two successive signals $Y_0$ and $Y_1$ on line 59 are coupled through CCD shift register 65 to CCD adder 66 where the terms are added and coupled through amplifier 67 to the output over line 68 which represents the Fourier coefficient $F_0$ and is designated as the seventh discrete analog output signal. $Y_0$ and $Y_1$ are also coupled over lines 68 and 59 respectively to CCD subtractor 70 where $Y_1$ is substracted from $Y_0$ with the output passing through amplifier 71 to the output over line 72 which represents the Fourier coefficient $F_4$ and is designated as the eighth discrete analog output signal. Each data path through the first second and third arithmetic stage may be regarded as a data channel.

The term $Y_4$ and $Y_5$ are coupled over line 60 to an input of multiplier 73. Generator 74 generates the sequence 1, $W^2$ which is repeated for every 8-point FFT and is coupled to an input of multiplier 73 over line 75. Multiplier 73 functions to multiply $Y_4$ by 1 and $Y_5$ by $W^2$. The terms $Y_4$ and $Y_5W^2$ on line 80 are coupled through CCD shift register 76 to CCD adder 77 where the two terms are added together and coupled through amplifier 78 to line 79 which is the Fourier coefficient $F_2$ and designated as the ninth discrete analog output signal. The terms $Y_4$ and $Y_5W^2$ are also coupled over lines 79 and 80 respectively to CCD subtractor 81 where $Y_5W^2$ is subtracted from $Y_4$ having an output coupled through amplifier 82 to line 83 which represents the Fourier coefficient $F_6$ and is designated as the tenth discrete analog output signal.

The terms $Y_2$ and $Y_3$ are coupled over line 63 to an input of multiplier 84, weight generator 85 generates the weight sequence 1, W which is repeated for every 8-point FFT and is coupled to an input of multiplier 84 over line 86. The term $Y_2$ is multiplied by 1 and the term $Y_3$ is multiplied by W. The terms $Y_2$ and $Y_3W$ are coupled over line 87 through CCD shift register 88 to CCD adder 89 which adds the two terms together to form an output which is coupled through amplifier 90 to line 91 which represents the Fourier coefficient $F_1$ and is designated as the eleventh discrete analog output signal. The terms $Y_2$ and $Y_3W$ are also coupled over lines 91 and 87 respectively to CCD subtractor 93 where the term $Y_3W$ is subtracted from $Y_2$. The output of subtractor 93 is coupled through amplifier 94 to line 95 which signal represent the Fourier coefficient $F_5$ of an 8-point FFT and is designated as the twelfth discrete analog output signal of the third arithmetic stage 58.

The terms $Y_6$ and $Y_7$ are coupled over line 64 to an input of multiplier 96. Weight generator 97 generates the weight sequence 1, $W^3$ which is repeated for each 8-point FFT. Weight generator 97 is coupled over line 98 to an input of multiplier 96 where the term $Y_6$ is multiplied by 1 and the term $Y_7$ is multiplied by $W^3$. The weight $W^3$ is equal to $e^{-3j\pi/4}$ for an 8-point FFT. The output of multiplier 96 is coupled over line 99 through CCD shift register 100 to CCD adder 101 where the terms $Y_6$ and $Y_7W^3$ are added together. The output of adder 101 is coupled through amplifier 102 to line 103 which represents the Fourier coefficient $F_3$ and is designated the thirteenth discrete analog output signal. The terms $Y_6$ abd $Y_7W^3$ are also coupled over lines 103 and 99 respectively to CCD subtractor 105 where the term $Y_7W^3$ is subtracted from $Y_6$. The output of subtractor 105 is coupled through amplifier 106 to line 107 which represents the Fourier coefficient $F_7$ of an 8-point FFT and is designated as the fourteenth discrete analog output signal. The seventh through fourteenth discrete analog output signals therefore represent the Fourier coefficients resulting from the calculation of the fast Fourier transform of the analog input signal.

Figure 4:
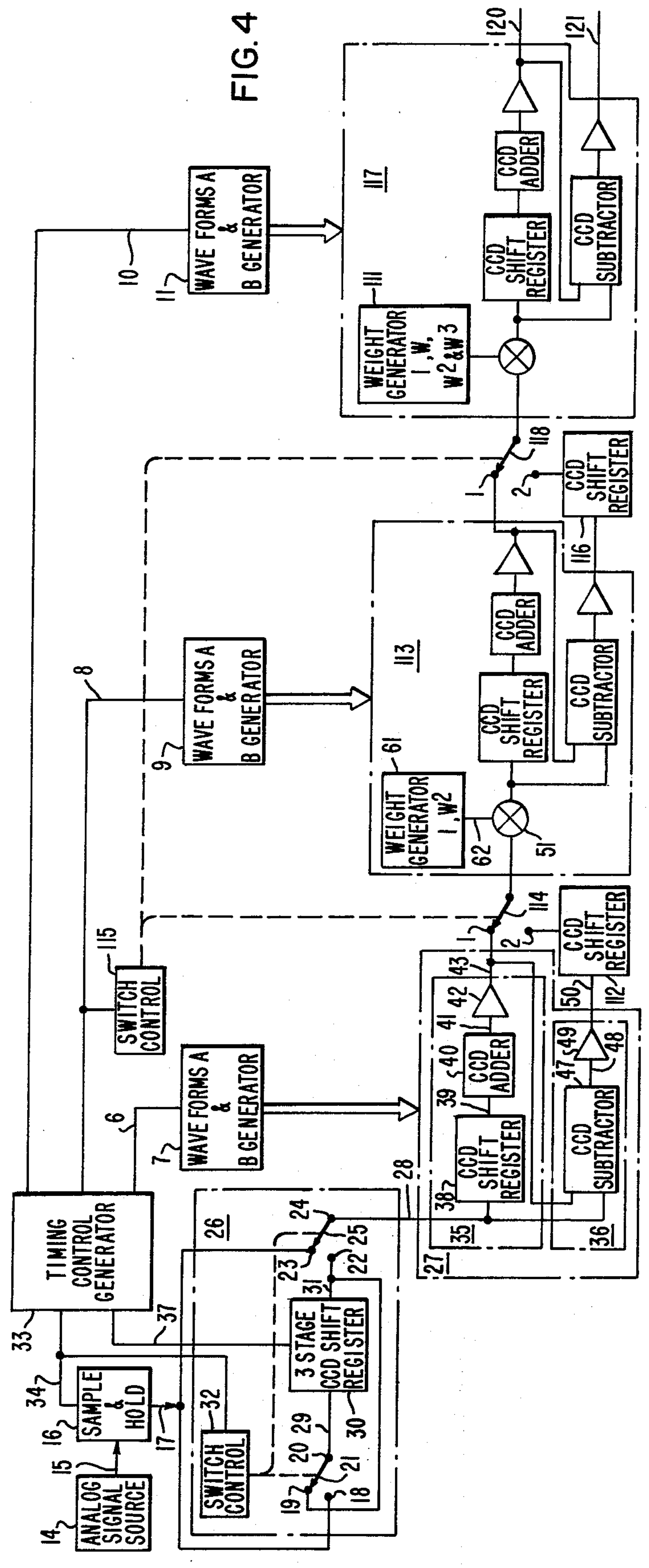
FIG. 4 is an alternate embodiment of the invention.

Referring now to FIG. 4, an alternate embodiment of the invention is shown where like references are used for functions corresponding to the apparatus of FIG. 3. Instead of data paths branching out into a plurality of channels in the second and third arithmetic stage, as shown in FIG. 3, two channels or data paths are utilized in the first, second and third arithmetic stages. Each arithmetic stage has a channel for performing additions and a channel for performing subtractions. A multiplier is incorporated in the second and third arithmetic stage to provide means for weighting particular terms during calculation of the fast Fourier transform. The second arithmetic stage 113 has weights of 1 and $W^2$. The third arithmetic stage 117 has weights of 1, W, $W^2$, $W^3$. The output of one or more of the channels of the first arithmetic stage 27 may be coupled to a means for storage such as a shift register 112 and coupled out by multiplex data switch 114 to the second arithmetic stage 113. Likewise one or more of the output channels of the second arithmetic stage 113 may be coupled to a means for storage such as CCD shift register 116 which may hold the data until it is coupled out by multiplexed switching to the third arithmetic stage 117. In this configuration, the first, second and third arithmetic stages operate at the same data rate. The output of one or more of the channels of the first arithmetic stage 27 may be stored in CCD shift register 112 until the data is multiplexed or switched into the second arithmetic stage 113 by switch 114 under the control of switch control 115. Second arithmetic stage 113 may be, for example, arithmetic circuit 57 described with reference to FIG. 3. The output of one of the channels of second arithmetic stage 113 may be stored in CCD shift register 116 and coupled into the third arithmetic stage 117 by multiplex switch 118 under the control of switch control 115. The third arithmetic stage 117 is identical to arithmetic circuit 57 except weight generator 111 would provide the additional weights of W and $W^3$ to multiplier 51. Switch control 115, weight generator 61 in the second arithmetic stage 113 and weight generator 111 in the third arithmetic stage 117 can be sequenced to permit the data flow shown in FIG. 1 and the arithmetic calculations shown in FIG. 2. One example of a sequence of switch positions of switches 21, 25, 114, and 118 and of weights for generators 61 and 111 to provide the arithmetic calculations shown in FIG. 2 is shown in Table I.

TABLE I

| | Switch 21 Position | Switch 25 Position | Switch 114 Position | Generator 61 Weight | Switch 114 Position | Generator 111 Weight |
|---|---|---|---|---|---|---|
| Sequence Time ↓ | 1 | 1 | 1 | 1 | 1 | 1 |
| | 1 | 1 | 1 | 1 | 1 | W |
| | 1 | 1 | 1 | 1 | 1 | $W^2$ |
| | 1 | 1 | 1 | 1 | 1 | $W^3$ |
| | 2 | 2 | 2 | 1 | 2 | 1 |
| | 1 | 1 | 2 | $W^2$ | 2 | W |
| | 2 | 2 | 2 | 1 | 2 | $W^2$ |
| | 1 | 1 | 2 | $W^2$ | 2 | $W^3$ |

The output of the third arithmetic stage 117 on the channel containing the adder such as line 120 would have the Fourier coefficients in series but not necessarily be in the following order or $F_0$, $F_1$, $F_2$, and $F_3$. The channel containing the subtractor in the third arithmetic stage 117 may have an output on line 121 containing the Fourier coefficients of $F_4$, $F_5$, $F_6$, and $F_7$ which may be arranged in a particular sequence. The timing signals on lines 6, 8 and 10 and from generators 7, 9, and 11 would move the data through the first, second and third arithmetic stages at the proper times.

Figure 5:
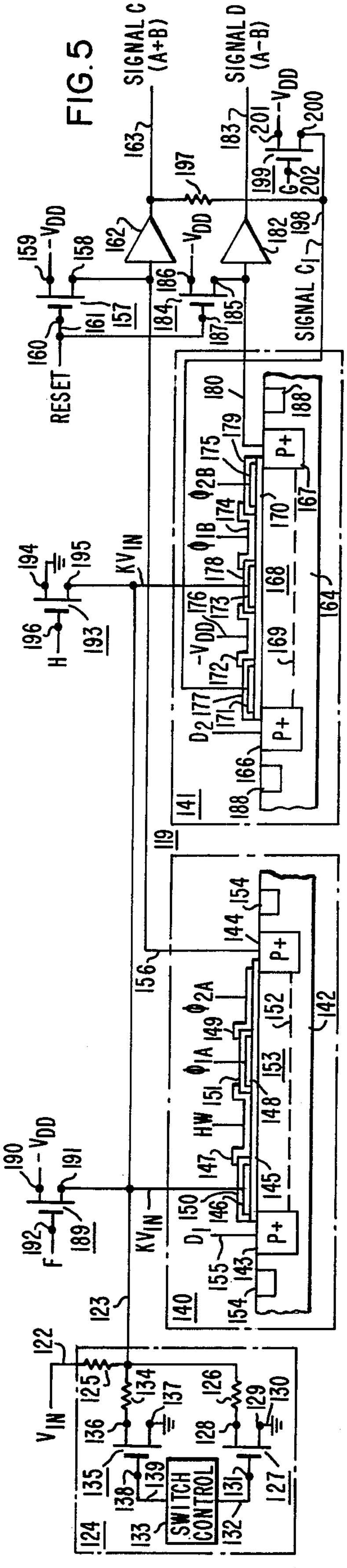
FIG. 5 is a circuit for performing analog arithmetic calculations.

Referring now to FIG. 5 a circuit for performing analog arithmetic calculations utilizing charge couple devices is shown and corresponds, for example, to arithmetic circuit 57 shown in FIG. 3. An input for analog signals may, for example, be line 122 which is coupled to a means for multiplying 124 for multiplying the input analog signals by one of a plurality of predetermined numbers or weights to generate a first signal on line 123. The multiplier and weight generator may be indicated generally by reference numeral 124. The analog input signal is coupled over line 122 through resistor 125 to line 123 and from line 123 through resistor 126 and switch 127 by way of terminals 128 and 129 to ground over line 130. The control of switch 127 at terminal 131 is coupled over line 132 to switch control 133. Switch control 133 functions to turn switch 127 on or in the conducting state and off or in the non-conducting state between terminals 128 and 139. The effect of turning switch 127 on and off results in connecting the resistor divider or resistors 125 and 126 to ground to cause a division of the input analog voltage on line 122 across resistors 125 and 126 and a very small amount across switch 127. The typical resistance of resistor 125 is 1K ohms and for resistor 126 is 10K ohms and for switch 127 in the conducting state is 10 ohms. The output analog voltage on line 123 may be represented as a constant K times the voltage of the input analog signal on line 122, $KV_{IN}$. K is determined by the equation for the resistor divider which in this case is shown by equation (3).

$$K = \frac{R_{126} + R_{127}}{R_{125} + R_{126} + R_{127}} \tag{3}$$

The resistance of switch 127, $R_{127}$, in the conducting state is much less than, by several orders of magnitude, the resistance of resistor 125 or resistor 126. The mathematical expression for K may be simplified as shown in equation (4) where the resistance effects of switch 127 are neglected.

$$K = \frac{R_{126}}{R_{125} + R_{126}} \tag{4}$$

When switch 127 is in the non-conducting or off state, the resistance of switch 127, $R_{127}$, is much greater, by several orders of magnitude, than the resistance of resistor 125 or resistor 126. When switch 127 is in the off state, the analog input voltage on line 122 is also on line 123 if line 123 feeds high impedance electrodes of a CCD device and no current is flowing through resistor 125. K for the condition with switch 127 in the off condition, would equal one. Switch 127 may, for example, be a P channel MOS transistor which may be turned on by a voltage on terminal 131 of −15 volts, for example, and turned off by a voltage of 0 volts, for example. Resistors 125 and 126 may be diffused resistors such as by a P diffusion in an N type semiconductor material.

Different values of K to provide an output signal on line 123 of $KV_{IN}$ may be provided by switching in and out additional resistor divider networks which would be operated similarly to the one heretofore described. For example, an analog input signal on line 122, $V_{IN}$ may pass through resistor $R_{125}$, resistor 134 and switch 135 at terminals 136 and 137 to ground. The control of switch 135 at terminal 138 is coupled over line 139 to switch control 133 for turning switch 135 in the on or off state. Switch control 133 can therefore multiply the input signal $V_{IN}$ on line 122 by one of two constants by turning either switch 127 or switch 135 on. If both switches are off then the input signal on line 122 is multiplied by the number one or left unchanged having an output on line 123, $V_{IN}$. The output of means for multiplying 124 is coupled over line 123 to a first charge couple device 140 and a second charge couple device 141.

In order to facilitate the injection of the proper amount charge into the first and second CCD 140 and 141 respectively, means for biasing the analog signal inputs are provided.

During certain times during the procedure for injecting charge into the first CCD, line 123 is biased to −15 Volts. During certain times during the procedure for injecting charge and subtracting charge in the second CCD, line 123 is biased to 0 volts and line 198 is biased to −15 volts. Referring to FIG. 5, line 123 is coupled through switch 189 to −15 volts or $-V_{DD}$. Switch 189 has terminal 191 which is coupled to line 123 and terminal 190 which is coupled to $-V_{DD}$ supply. The control of switch 189 is coupled over line 192 to signal F which at the appropriate times as shown in FIG. 6 turns switch 189 to the conducting or nonconducting state. Switch 189 may be, for example, a field effect transistor. When switch 189 is in the conducting state, line 123 will be pulled or biased towards −15 volts or $-V_{DD}$. When switch 189 is in the non-conducting state, line 123 will be unaffected or unbiased by switch 189 and will have its normal analog signal $KV_{IN}$. Line 123 is coupled through switch 193 to 0 volts or ground. Switch 193 has terminal 195 which is coupled to line 123 and terminal 194 which is coupled to 0 volts supply or ground. The control of switch 193 is coupled over line 196 to signal H which at the appropriate times as shown in FIG. 6 turns switch 193 to the conducting state or to the non-conducting state. Switch 193 may be, for example, a field effect transistor. When switch 193 is in the conducting state, line 123 will be pulled or biased towards 0 volts or ground. When switch 193 is in the non-conducting state, line 123 will be unaffected or unbiased by switch 193 and will have its normal analog signal $KV_{IN}$. Line 198, signal $C_1$, is coupled through resistor 197 to line 163, signal C. Resistor 197 functions to isolate line 163 from line 198 to permit line 198 to be biased to −15 volts. Line 198 is coupled to terminal 200 of switch 199. Terminal 201 of switch 199 is coupled to −15 volts or $-V_{DD}$. The control of switch 199 is coupled over line 202 to signal G which at the appropriate times as shown in FIG. 6 turns switch 199 to the conducting state or to the non-conducting state between terminals 200 and 201. Switch 199 may be, for example, a field effect transistor. When switch 199 is in the conducting state line 198 will be pulled or biased towards 0 volts or ground. When switch 199 is in the non-conducting state, line 198 will be unaffected or unbiased by switch 199 and will have its normal analog signal $C_1$ which is coupled through resistor 197 from line 163, signal C. Resistor 197 is selected to provide isolation from line 163 and to permit signal C to be coupled through to line 198. Resistor 197 might be a switch, for example, controlled by complement of signal G.

The circuitry of the first charge coupled device 140 is shown in cross-section in FIG. 5 and represented functionally in FIG. 3 by, for example, CCD shift register 65 and CCD adder 66 which forms a portion of the third arithmetic 58. Referring now to FIG. 5, the first charge coupled device 140 is comprised of a substrate 142 of N type material having two spaced apart P+ diffusions 143 and 144. On the surface of the substrate 142 is a layer of dielectric material 145 which may for example be silicon dioxide or a combined layer of silicon dioxide and silicon nitride to provide electrical insulation and to control the electric field between electrodes placed above dielectric material 145 and regions within substrate 142. Electrodes 146, 147, 148 and 149 are placed adjacent one another in series on dielectric material 145 and are adjusted in size to cover substrate 142 between the spaced apart diffusions 143 and 144 to control minority carrier charge in the region between the two spaced apart diffusions 143 and 144. Electrode 146 is positioned on the surface of dielectric material 145 between diffusion 143 and electrode 147 which functions to generate an electric field in substrate 142 below the insulation layer 145 to control charge and charge packets in substrate 142. Above electrode 146 may be a layer of insulation 150 to permit electrode 147 to overlap electrode 146 without electrical shorting. Electrode 146 is coupled to line 123, signal $KV_{IN}$. Electrode 146 may, for example, be polysilicon material and the insulation layer 150 covering electrode 146 may for example be silicon dioxide. Between electrode 146 and electrode 148 is electrode 147 which is coupled to signal HW which functions to provide a holding well underneath electrode 147 in substrate 142. The holding well is caused by the voltage on electrode 147 which generates an electric field within substrate 142. Electrode 147 may, for example, be vacuum deposited aluminum which may overlap electrodes 146 and 148 without electrical shorting to provide an electric field under electrode control in substrate 142. Between electrode 147 and electrode 149 is electrode 148 which may, for example, be polysilicon material with an insulation layer 151 of silicon dioxide to permit electrodes 147 and 149 to overlap electrode 148. Electrode 148 is coupled to signal $\phi_{1A}$. Between electrode 148 and diffusion 144 is electrode 149 which may for example be vacuum deposited aluminum which is coupled to signal $\phi_{2A}$ which is a signal for generating an electric field within substrate 142 for controlling charges and charge packets. The arrangement of electrodes 146, 147, 148, and 149 is provided to generate electric fields within substrate 142 in response to signals on the electrodes to control charges and charge packets and to move charges and charge packets in the region between diffusion 143 and diffusion 144. Channel 153 is the region in substrate 142 where charges are under the influence and control of electrodes 146, 147, 148, and 149 and is described as the region between diffusions 143 and 144 from the surface of substrate 142 to a depth 152 which designates the limit within substrate 142 where charges and charge packets are controlled. Channel 153 is shown in FIG. 5. The extent of width of the channel transverse to the space between diffusions 143 and 144 is controlled by the extent of electrodes 146, 147, 148, and 149. In any event, the extent of channel 153 is controlled by an N+ diffusion into substrate 142 which encircles the CCD device including the electrodes and the diffusions 143 and 144. The N+ diffusion is indicated by reference numeral 154 and in FIG. 5 is shown on the outside of diffusion 143 and on the outside of diffusion 144 since diffusion 154 encircles the CCD device and functions to provide a channel stop where charge and charge packets are stopped. Diffusion 143 is electrically coupled to line 155 which in turn is coupled to signal $D_1$. Diffusion 144 is electrically coupled line 156 which provides an output from first charge coupled device 140. Line 156 is coupled to switch 157 which functions to couple line 156 to $-V_{DD}$ through terminals 158 and 159. The control of switch 157 is coupled at terminal 160 to line 161 which is connected to signal Reset. Switch 157 functions to be in the conduction state or non-conducting state under the control of signal Reset. Line 156 is coupled to an input of amplifier 162 which functions to amplify the voltage on line 156 to provide unity gain through the first charge coupled device 140 and to act as a puffer circuit to prevent its output from being effected by the circuit it is connected to. The output of amplifier 162 is coupled to line 163 and is designated as signal C and represents at specified times the addition of two signals fed sequentially into the first charge coupled device 140 of line 123.

Charge is injected into the first charge coupled device 140 by diffusion 143. Diffusion 143 is held by signal $D_1$ to a zero volt potential as shown in FIG. 6 at times A1 and B10. Electrode 146 is first brought to −15 volts potential, signal $KV_{IN}$, at times A1 and B10 which creates an attractive field within channel 153 under electrode 146 for charge. Electrode 147 which is controlled by signal HW is at −15 volts to make the region under electrode 147, called the holding well, attractive to charge which is injected by diffusion 143. Diffusion 143 forms a PH injecting diode across the boundary between diffusion 143 and the N type substrate 142. With electrode 146 at −15 volts which is controlled by signal $KV_{IN}$ the region in the channel 153 under the influence of the electric field emanating from electrode 146 and electrode 147 is completely filled with charge which consists of minority carriers or holes. The potential of electrode 146 is then set to the value $KV_{IN}$ at times A2 and B11 which may be some voltage between −15 volts and zero volts. Signal $D_1$ then goes to −15 volts at times A3 and B12 which backbiases the P+ diffusion 143 with respect to the N type substrate 142 and channel 153. The charge in channel 153 below electrode 146 flows back into diffusion 143 until the surface state potential below electrode 146 is in equilibrium with the potential of electrode 146. Charge under electrode 147 in the channel 153 passes under electrode 146 into diffusion 143 until the surface state under electrode 147 in channel 153 is equal to the surface state under electrode 146. Electrodes 146 and 147 and diffusion 143 provide a means for injecting charge into channel 153 which is proportional to the desired signal, $KV_{IN}$. During this time, the potential on electrode 148 is held by signal $\phi_{1A}$ to zero volts which causes the region below electrode 148 in channel 153 to be unattractive to charge or charge packets. When signal $KV_{IN}$ went from −15 volts to the desired input signal, the region below electrode 146 became less attractive to charge. The region under electrode 147 however remains at −15 volts and remains attractive to charge. Therefore, when signal $D_1$ goes to −15 volts, the charge above the surface state potential under electrode 146 and electrode 147 is removed through diffusion 143. The charge below the surface state potential of electrode 146 is held underneath electrode 146 and electrode 147 resulting in a pocket of charge or packet of charge being held below electrode 147. The charge above the surface state potential underneath electrode 147 has been scuppered or pulled back underneath electrode 146 in channel 153 to the injecting diode or diffusion 143.

For a more detailed description of one example of charge injection into a charge coupled device reference is made to U.S. patent application Ser. No. 625,701, filed on Oct. 24, 1975, entitled "Stabilized Charge Injector for Charge Coupled Devices," assigned to the assignee hereof which is a continuation in part of U.S. patent application Ser. No. 507,115, filed Sept. 17, 1974, now abandoned, entitled, "A Programmable Analog Transversal Filter," assigned to the assignee hereof which is incorporated by reference herein.

Signal $\phi_{1A}$ then goes to −15 volts at times A4 and B13 which causes the region in channel 153 below electrode 148 to be attractive to charge. At time A5 signal H goes to −15 volts which turns switch 193 to the conducting state which biases electrode 146 to ground or 0 volts.

The region below electrode 146 is unattractive to charge and the potential of electrode 146 will not be affected by the reset signal on the prior stage. A portion of the charge in channel 153 underneath electrode 147 is therefore attracted to the region below electrode 148. At the same time or subsequently the signal $\phi_{2A}$ goes to −15 volts at times A8 and B14 which causes the region in channel 153 below electrode 149 to be attractive to charge. Some of the charge below electrode 148 is therefore attracted to the region in channel 153 below electrode 149. At times A9 and B15 signal $\phi_{1A}$ goes to zero volts which causes the region below electrode 148 to be unattracted to charge and the charge below region 148 is therefore attracted and moved to the region below electrode 149. Electrodes 148 and 149 provide a means for isolating the charge in channel 153 that has been previously injected from the means for injecting charge or from the region in channel 153 underneath electrodes 146 and 147. At times A10 and B16 signal $\phi_{2A}$ goes to zero volts which causes the region in channel 153 below electrode 149 to be unattractive to charge. The charge underneath electrode 149 in the channel therefore is driven to diffusion 144 which provides a means for collecting the charge. Signal $\phi_{1A}$ remains at zero volts which maintains the region below electrode 148 to be unattractive to charge. Diffusion 144 therefore attracts all the charge underneath electrode 149. The potential of the charge in diffusion 144 or collecting diode 144 which is formed between diffusion 144 and the N type substrate is coupled out over line 156 which provides a signal proportional to the charge collected by the collecting diode or diffusion 144. The potential on line 156 is coupled to the input of amplifier 162 which provides a means for amplifying the signal on line 156 to maintain unity signal gain through the charge coupled device 140 so that the sum of the amplitudes of the signal $KV_{IN}$ injected appears at the output of amplifier 162 on line 163. The charge stored in diffusion 144 at time A10 is not removed at this time but held there while additional charge is injected into channel 153 by diffusion 143 in conjunction with electrodes 146 and 147 utilizing a subsequent signal on line 123 for the input, $KV_{IN}$ at times B10 through B16. The charge injected during B10 through B16 into channel 153 is injected in the same manner as at times A1 throug A10 for charge injection. The injected charge is moved or shifted to diffusion 144 by causing the regions under electrodes 148 and 149 to be attractive to charge and then unattractive to charge as previously described. The combined charge in diffusion or collecting diode 144 at time B16 increases the potential on line 156 which is proportional to the total charge collected by diffusion 144. Amplifier 162 has an output, signal C at time B16 which is equal to the addition of the two signals on electrode 146 one signal subsequent to the other at the times of injecting charge into the channel 153. Switch 157 provides a means for removing charge collected by the collecting diode 144 or diffusion 144. Switch 157 is placed in the conducting state at times A6 through A7 by a −15 volts potential on terminal 160 which couples line 156 to the potential $-V_{DD}$ under the control of the signal reset on line 161.

The second charge coupled device 141 performs the function of subtracting one signal from another or taking the difference of two signals. The cross-section of a structure for accomplishing the function of the second charge coupled device 141 is shown in FIG. 5. Substrate 164 is made of suitable material for charge coupled devices such as N type doped silicon or has a surface layer of some depth of N type doped silicon on a supporting substrate. Two spaced apart P+ diffusions, diffusion 166 and diffusion 167, are diffused into substrate 164 to form two ends of a channel 168 having a depth within the substrate material 164 indicated by the dotted line 169. Above substrate 164 is a layer of insulation 170 which extends from diffusion 166 to diffusion 167 suitable for placing electrodes thereon. Electrodes 171, 172, 173, 174, and 175 are mounted on insulation layer 170 for controlling and moving the charge in channel 168. Between diffusion 166 and electrode 172 is electrode 171 for controlling the injection of charge from injecting diode 166 or diffusion 166 into the channel 168. Between electrode 171 and electrode 173 is electrode 172 for providing a holding well for charge within channel 168. Electrode 172 is coupled over line 176 to a voltage source, signal $-V_{DD}$. Electrode 171 may for example be polysilicon material having an oxide layer over top to provide insulation. Electrode 172 may for example be vacuum deposited aluminum which may overlap electrode 171 to provide a continuous control of charge in channel 168. Between electrode 174 and electrode 172 is electrode 173 which is coupled to line 123 to hold a potential of a signal, B, which is subtracted from a signal, a signal A, which is coupled to electrode 171 on line 198. Electrode 173 may for example, be composed of polysilicon material with an oxide 178 over top to provide insulation. Electrode 172 may overlap the insulation layer 178 and electrode 173 underneath to provide a continuous electronic field influence in channel 168 to control the minority charge in channel 168 in the region below electrodes 172 and 173. Between electrode 175 and electrode 173 is electrode 174 which may for example be vacuum deposited aluminum which may overlap insulation layer 178 to provide a continuous control of charge in channel 168. Electrode 174 is coupled to signal $\phi_{1B}$ and provides a means for separating a portion of charge injected into channel 168 by diffusion 166 and electrodes 171 and 172. Between diffusion 167 and electrode 174 is electrode 175 which may for example be composed of polysilicon material having an insultion layer 179 over top. Electrode 174 may overlap insulation 178 to provide continuous control of the charge in channel 168 in the region beneath electrodes 174 and 175. Electrode 175 is coupled to signal $\phi_{2B}$ which in conjunction with electrode 174 provides a means for separating a portion of charge previously injected into channel 168 by diffusion 164 and electrodes 171 and 172. Electrode 175 may extend on insulation layer 170 above diffusion 167 to provide control of the charge in channel 168 in the region below electrode 175 up to diffusion 167. Diffusion 167 provides a means for collecting charge which is forced into diffusion 167 when electrodes 174 and 175 cause the region beneath them and channel 168 to be unattractive to charge. The potential of collecting diode 167 or diffusion 167 is coupled out over line 180 to amplifier 182. Amplifier 182 provides a means for amplifying its input signal to maintain unity gain or constant signal levels through the second charge coupled device 141 following subtraction and has an output at time B9 on line 183, signal D, representative of the signal A-B, the two signals represented. Switch 184 provides a means for removing charge collected by diffusion 167. Line 180 is coupled to terminal 185 of switch 184 while terminal 186 of switch 184 is coupled to voltage $-V_{DD}$ which typically may be −15 volts. The signal Reset on line 161 is coupled to the control of switch 184 at terminal 187. Switch 184 under the control of signal Reset is turned on or in the conducting state or off in the non-conducting state. When switch 184 is turned on, the voltage $-V_{dd}$ pulls the voltage on line 180 down to voltage $-V_{DD}$ and pulls the charge collected by diffusion 167 out through switch 184 to voltage $-V_{DD}$.

The width of channel 168 transverse to the direction between diffusions 166 and 167 where charge is controlled is determined by the width of electrodes 171 through 175 which normally have a predetermined width resulting in electrodes 171 through 175 having rectangular shapes having various lengths as shown in FIG. 5 and having uniform widths (not shown). The extent of the width of channel 168 is limited by a N+ diffusion 188 which encircles the electrodes and diffusions to provide a channel stop.

Charge is injected into channel 168 proportional to the output of amplifier 162, signal C, on line 163 which is coupled through resistor 197 to electrode 171. At time B1, as shown in FIG. 6, electrode 173 is pulled or biased to 0 volts by signal H which has turned switch 193 to the conducting state. At time B2, signal $D_2$ pulls diffusion 166 to 0 volts and $-V_{DD}$ is on electrode 172. Electrode 171, signal $C_1$, is pulled to −15 volts by signal G which has turned switch 199 to the conducting state and biased signal $C_1$ and electrode 171 to −15 volts. The region below electrodes 171 and 172 are now attractive to charge. Charge from diffusion 166 fills the region below electrodes 171 and 172.

At time B3, electrode 171 goes from −15 volts to signal $C_1$ unbiased by switch 199 because signal G has turned switch 199 to the non-conducting state. The output of amplifier 162 signal C has a voltage indicative of signal A which is coupled through resistor 197 as signal $C_1$ which is present on electrode 171. Subsequently at time B4, signal $D_2$ on diffusion 164 goes to −15 volts which causes charge in the region below electrodes 171 and 172 to be drawn back into diffusion 166 that have a surface state potential above the voltage on electrode 171. The charge is scuppered past electrode 171 into diffusion 166 and electrode 171 acts as a barrier having a threshold equal to signal $C_1$ representative of the prior signal A where charge above the threshold is drawn back into diffusion 166. The result of this sequence of events places charge in the holding well under electrode 172 equivalent to the voltage placed on electrode 171. At time B5, electrode 173 goes from 0 volts to signal $KV_{IN}$ unbiased by switch 193 because signal H has turned switch 193 to the non-conducting state. At time B5 the signal $KV_{IN}$ is also designated as signal B since it is the second term on line 123 to be used. The first term was signal A or $KV_{IN}$ at time A2. Signal B on line 123 or signal $KV_{IN}$ at time B5 provides a threshold barrier to the charge underneath electrode 172 proportional to the voltage on electrode 173. At time B6, signal $\phi_{1B}$ goes to −15 volts, the region below electrode 174 is attractive to charge. The charge underneath electrode 172 which represents signal A and which exceeds the threshold underneath electrode 173 at the voltage of signal B will pass from below electrode 172 underneath electrode 173 to below electrode 174. The charge below electrode 174 represents the difference of signal B from signal A. Subsequently at time B7, $\phi_{2B}$ goes to −15 volts which causes the region below electrode 175 to be attractive to charge which attracts the charge underneath electrode 174. At time B8, signal $\phi_{1B}$ goes to zero volts which causes the region below electrode 174 to be unattractive to charge and drives or pushes the charge below electrode 175. At time B9, signal $\phi_{2B}$ goes to zero volts which causes the region below electrode 175 to be unattractive to charge and drives or pushes the charge into diffusion 167 also known as the collecting diode 167. The potential or voltage of diffusion 167 is coupled over line 180 to amplifier 182 which provides an output signal on line 183 equivalent to signal A minus signal B. The charge in diffusion 167 is subsequently drained off by switch 184 at time A6 by signal Reset after the signal A-B is utilized.

The sequence of operation of arithmetic circuit 119 shown in FIG. 5 which is similar in function to arithmetic circuit 57 is described with reference to FIG. 6 which shows all of the appropriate waveforms for the control and data signals. Referring to FIG. 6, the abscissa represents time indicated by A1 through A10 and B1 through B16. The ordinate represents a voltage level for each of the numerous waveforms shown. At time A1 signal F goes from zero volts to −15 volts which turns switch 189 on or in the conduction state which in turn causes $KV_{IN}$ to go to −15 volts. Electrode 146 at a potential of −15 volts, causes the region in channel 153 below electrode 146 to be attractive to charge. Signal $D_1$ goes to zero volts which supplies charge to the region below electrode 146. Signal HW is at −15 volts and the region below electrode 147 is attractive to charge in channel 153. At time A2 signal F goes to zero volts which opens switch 189 and allows signal $KV_{IN}$ to return unbiased to its normal analog voltage due to the input signal. At time A3 signal $D_1$ goes from zero volts to −15 volts which causes some of the charge below electrodes 146 and 147 to flow back into diffusion 143. The remaining charge underneath electrode 147 in channel 153 is proportional to the signal $KV_{IN}$. At time A4 signal $\phi_{1A}$ goes from zero to −15 volts which causes the region below electrode 148 in channel 153 to be attractive to charge. At time A5, signal H goes from 0 to −15 volts which causes switch 193 to close. Signal $KV_{IN}$ on line 123 and electrode 146 will be biased to 0 volts or ground. The region below electrode 164 will be unattractive to charge resulting in a barrier to the movement of charge from the region below electrodes 147 and 148 back to diffusion 143. The biasing of electrode 146 prevents undesired scuppering of charge underneath electrode 146 to diffusion 143 after the prior stage has its charge removed from its collecting diodes by signal Reset at time A6. At time A6, signal reset goes from zero volts to −20 volts which causes switch 157 and switch 184 to close or go into the conduction state. When switches 157 and 184 are closed the charge collected in diffusion regions 144 and 167 are drained off over lines 156 and 180 respectively. The charge underneath electrode 148 in channel 153, however, is not drained off through switch 157 because the region below electrode 149 acts as a barrier to the charge due to the fact that signal $\phi_{2A}$ is at zero volts. With the charge drained off diffusions 144 and 167, the inputs to amplifiers 162 and 182 will be at a low voltage such as $-V_{DD}$ or −15 volts and the output will likewise be at a low voltage or −15 volts on lines 163 and 183, respectively. At time A7 signal reset goes from −20 volts to zero volts. At time A8, signal $\phi_{2A}$ goes from zero volts to −15 volts causing the region in channel 153 below electrode 149 to be attractive to charge. At time A9 signal $\phi_{1A}$ goes from −15 volts to zero volts causing the region in channel 153 below electrode 148 to be unattractive to charge which causes the charge to move under electrode 149. At time A10, signal $\phi_{2A}$ goes from −15 volts to zero volts causing the region in channel 153 below electrode 149 to be unattractive to charge causing the charge to move into diffusion region 144 where the charge is collected. Signal H goes from −15 volts to 0 volts which causes switch 193 to open. Signal $KV_{IN}$ on line 123 and electrode 146 will be unbiased and will be at the voltage of $KV_{IN}$. Signal HW is at −15 volts causing the region below electrode 147 to be attractive to charge but since signal $D_1$ is at −15 volts the region below electrode 147 does not fill up with charge until time B10 when signal $D_1$ goes to 0 volts. At time A10 signal C on line 163 is at a voltage in response to the potential on line 156 due to the charge collected in diffusion region 144. The waveforms during times A1 through A10 function to store in diffusion region 144 charge which is proportional to or representative of the signal at the input $KV_{IN}$ during time A3 through A5. The charge in diffusion region 144 is stored or preserved until more charge is added during time period B1 through B16.

At time B1, signal H goes from zero volts to −15 volts which causes switch 193 to go into the conduction state clamping or biasing signal $KV_{IN}$ to 0 volts or ground through switch 193. With electrode 173 at ground potential, the region in channel 168 below electrode 173 will be unattractive to charge. At time B2, signal $D_2$ goes from −15 volts to zero volts and signal G goes from zero volts to −15 volts, causing switch 199 to close or be in the conduction state which pulls, biases or clamps line 198, signal $C_1$, to $-V_{DD}$ volts or −15 volts. Line 198 causes the region in channel 168 below electrode 171 to be attractive to charge. Diffusion region 166 provides charge to fill the channel below electrodes 171 and 172. At time B3, signal G goes from −15 volts to zero volts causing switch 199 to open or be in the non-conducting state allowing a signal $C_1$ to be unbiased. At time B4, signal $D_2$ goes from zero volts to −15 volts causing charge in channel 168 below electrodes 171 and 172 to be pulled back into diffusion 166 dependent on the voltage of electrode 171, signal $C_1$. Electrode 171, signal $C_1$, is held to a voltage by the output of amplifier 162, signal C, which represents the signal $KV_{IN}$ at times A3 and A5, signal A, that is stored in diffusion region 144. At time B5, signal H goes from −15 volts to zero volts causing switch 193 to open or be in the non-conducting state allowing signal $KV_{in}$ to be unbiased. The voltage on line 123, signal $KV_{IN}$, between times B5 and B7 represents the second term, signal B, to be algebraically combined to the first term, signal A. The signal on line 123, signal $KV_{IN}$ or signal B, causes electrode 173 to have a particular potential causing the region below electrode 173 in channel 168 to have a limited attractive region and a unattractive region below deeper in the channel away from electrode 173 which results in a barrier in the channel. At time B6, signal $\phi_{1B}$ goes from zero to −15 volts causing the region below electrode 174 in channel 168 to be attractive to charge. The charge below electrode 172 which exceeds the surface state potential or barrier below electrode 173 will be pulled to the region below electrode 174 in channel 168. The charge that is allowed to be attracted to the region below electrode 174 represents the difference of the first signal $KV_{IN}$ at times A3 through A5, signal A, and the second signal $KV_{IN}$ at times B5 through B7, signal B. This corresponds to the case where the absolute value of signal A is larger than the absolute value of signal B. If the charge below electrode 172 does not exceed the surface state potential or barrier below electrode 173 then no charge will be pulled to the region below electrode 174 in channel 168. This corresponds to the case where the absolute value of signal B is larger than the absolute value of Signal A. At time B7, signal $\phi_{2B}$ goes from zero volts to −15 volts causing the region below electrode 175 to be attractive to charge. At time B8, signal $\phi_{1B}$ goes from −15 volts to zero volts causing the region below electrode 174 to be unattractive to charge. At time B9, signal $\phi_{2B}$ goes from −15 volts to zero volts causing the region below electrode 175 to be unattractive to charge causing the charge below electrode 175 to be pushed into diffusion region 167 which may also be called a collecting diode 167. The subtraction of signal B from signal A (A-B) is therefore complete.

To add B to A the following procedure is provided. At time B10, signal F goes from zero volts to −15 volts closing switch 189 causing line 123 to be clamped or biased to −15 volts or $V_{DD}$. Signal $D_1$ goes from −15 volts to zero volts causing the region in channel 153 below electrodes 146 and 147 to be filled with charge. At time B11, signal F goes from −15 volts to zero volts which opens switch 189 causing line 123, signal $KV_{IN}$, to resume its signal level, signal B at this time. At time B12, signal $D_1$ goes from zero volts to −15 volts causing charge in the region below electrodes 146 and 147 above the surface state potential to be scuppered or drawn back into diffusion 143 which may also be called an injecting diode 143. At time B13, signal $\phi_{1A}$ goes from zero volts to −15 volts causing the region below electrode 148 to be attractive to charge and to draw or pull a portion of charge held under electrode 147. At time B14, signal $\phi_{2A}$ goes from zero volts to −15 volts causing the region below electrode 149 to be attractive to charge. At time B15, signal $\phi_{1A}$ goes from −15 volts to zero volts causing the region in channel 153 below electrode 148 to be unattractive to charge causing charge movement to the region below electrode 149 and into diffusion region 144. At time B16, signal $\phi_{2A}$ goes from −15 volts to zero volts causing the region below electrode 149 to be unattractive to charge and causing charge movement into the diffusion region 144 which also may be called collecting diode 144. The addition of signal B to signal A is therefore complete.

At time B9 until the next reset pulse at A6, signal D on line 183 represents the difference of $KV_{IN}$ at time B5 through B7 subtracted from $KV_{IN}$ at time A3 through A5. At time B16 until the next reset signal at time A6, signal C on line 163 represents the summation or the addition of $KV_{IN}$ at time B5 through B7 and $KV_{IN}$ at time A3 through A5.

As shown in FIG. 3, adder 35 and subtractor 36 have the same structure as arithmetic circuit 44. Arithmetic circuit 57 differs from arithmetic circuit 44 by reason of the addition of weight generator 61 and multiplier 51. One arithmetic circuit as shown by arithmetic circuit 44 and three arithmetic circuits as shown by arithmetic circuit 57 are used to implement the third arithmetic stage 58. The waveforms shown in FIG. 6 are applicable for controlling adder 35 and subtractor 36, arithmetic circuit 44, arithmetic circuit 57 and the four circuits shown in the third arithmetic stage 58. The timing for weight generators 61, 74, 85 and 97 could be a clock pulse to a flip-flop or a counter prior to the use of signal $KV_{IN}$ on line 123. The logic state of the flip-flop or counter could be used to select the correct weight, K, for multiplication at a particular time with signal $V_{IN}$ to provide signal $KV_{IN}$. An appropriate clock pulse signal, for example, would be signal $\phi_{2A}$ shown in FIG. 6 which has a pulse which precedes the use of the signal $KV_{IN}$ on line 123. A reset signal may also be desirable to assure the logic state of the flip-flop or counter at particular times such as at the start of an 8 point FFT calculation at time T1 in FIG. 7. Since data is cascaded from the first arithmetic stage 27 to the second arithmetic stage 56, and from the second arithmetic stage 56 to the third arithmetic stage 58, the timing control waveforms for each arithmetic stage must be arranged so that data in the prior arithmetic stage is preserved until it is transferred into the following arithmetic stage. The data will be preserved from one arithmetic stage to the next if the time between B1 and B14 for the following state is less than the time between A1 and A6 for the prior stage. At time A6, the data from the prior stage is destroyed by the draining off of charge from the collecting diodes 144 and 167 by the Reset signal which goes from 0 volts to −20 volts. Therefore, the data in the prior stage must be transferred to the following stage before time A6. The two stages operate concurrently, the prior stage with A waveforms and the following stage with B waveforms shown in FIG. 6.

In the preferred embodiment of FIG. 3, the flow of data through the first arithmetic stage 27 to the second arithmetic stage 56 should experience no gain or loss in signal while the dynamic range of the signal may be 80 decibels. The gain of the data passing through arithmetic stage 27 shold be one or unity. Likewise, the data flowing through the second arithmetic stage 56 and the third arithmetic stage 58 should experience a gain of unity. A gain of unity assures that a signal will propogate through the first, second and third arithmetic stages or FFT without unwanted attenuation, regardless of the circuit path or charge coupled devices utilized. The gain of the charge coupled devices can be controlled by selecting the geometric size and voltage of the holding well which determines the size of the charge packet injected into the charge coupled device for a given input voltage. An example of an holding well in a charge coupled device, for example, is shown in FIG. 5 by electrodes 147 and 172 and the regions extending beneath the electrodes in channel 153 and channel 168 respectively. The voltage swing at the output terminal of the arithmetic circuit such as line 163 or line 183 is a function of the nodal capacitance on diffusion 144 or diffusion 167 respectively, and the gain of the amplifier 162 or amplifier 182. By adjusting the geometry of the electrode forming the holding well such as electrode 147 or electrode 172 to match the collecting diode or diffusion nodal capacitance such as diffusion 144 or diffusion 167, the gain of the charge coupled device can be controlled. The holding well voltage electrode 147 or electrode 172 and the amplifier gain can be adjusted external to the charge coupled device if necessary. To produce unity transfer characteristics of the signals from arithmetic stage to arithmetic stage such as shown in FIG. 3 or from arithmetic circuit to arithmetic circuit it is necessary to design the charge coupled device such that dimension variations due to processing, such as over or under etching, photo defects, etc., have a small effect on the capacitance of the critical nodes such as the size of the holding well and the capacitance of the collecting diode diffusion.

The holding well voltage on the electrode during charge injection is normally −15 volts, however, if the charge packet injected into the channel is too small to provide unity gain through the arithmetic stage, the holding well voltage may be set to a more negative voltage to increase the size of the charge packet injected into the channel. The setting of the holding well voltage to a less negative or more positive voltage will decrease the size of the charge packet injected into the channel. The gain of the amplifier can be adjusted externally by changing the amplifier resistance to ground.

Figure 7:
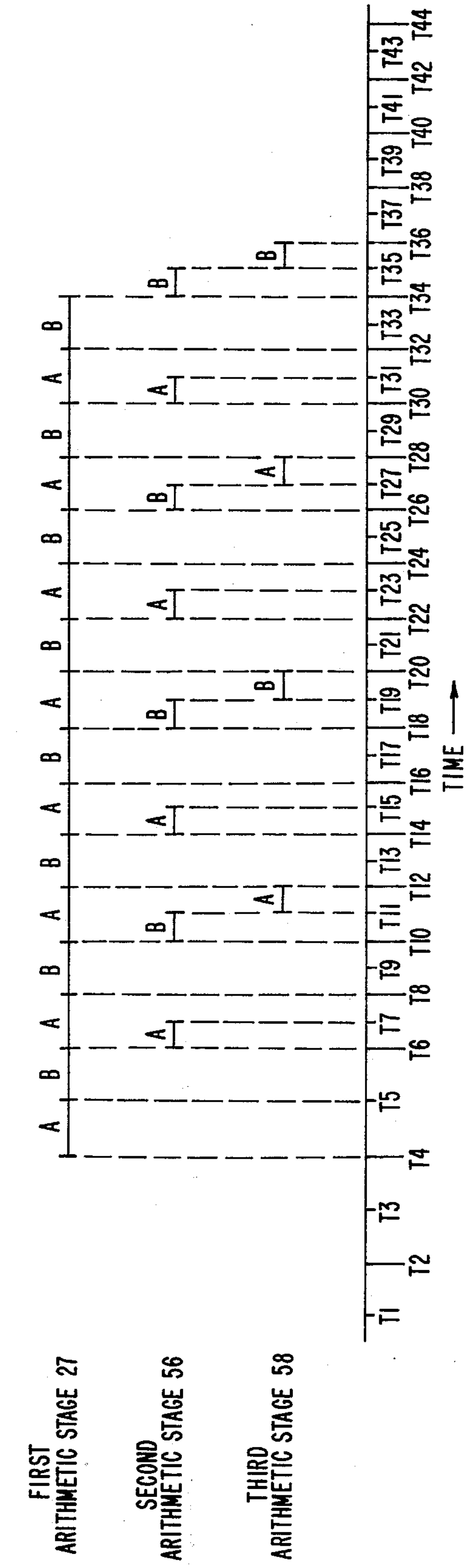
FIG. 7 shows the timing for the occurrence of waveforms shown in FIG. 6 in the operation of the embodiment in FIG. 3.

Referring to FIG. 7, the operation of the first, second, and third arithmetic stages of the embodiment of FIG. 3 is shown as a function of time for two successive 8 point FFT's. The ordinate represents the presence or absence of control signals to the respective stage where the control signals are shown in FIG. 6. The letter A in FIG. 7 or the waveforms referred to as waveforms A represent the control signals of FIG. 6 occurring from the time A1 through A10 and the letter B in FIG. 7 or the waveforms referred to as waveforms B represent the control signals in FIG. 6 occurring from the time B1 through B16. The abscissa represents time starting at T1 and ending at T44. First arithmetic stage 27 begins operation at T4 under the control of the waveforms as shown in FIG. 6 from A1 through A10. At T5 the first arithmetic stage 27 is controlled by the waveforms shown in FIG. 6 from B1 through B16. At T6, the first arithmetic stage 27 operates on the waveforms designated by A and the second arithmetic stage 56 operates on the waveforms designated by A. The first arithmetic stage 27 operating on the waveforms A from T6 through T8 may operate at a faster rate such as from T6 through T7. The second arithmetic stage 56 must operate with waveforms A from T6 through T7 in order to pick up the information in the first arithmetic stage 27 before the data held by the first arithmetic stage 27 is reset. At T8, the first arithmetic stage 27 operates under waveforms B through T10. At T10, the first arithmetic stage 27 operates under waveforms A through T12 or faster through T11 and the second arithmetic stage 56 operates under waveforms B through T11. The second arithmetic stage 56 must operate under B waveforms from T10 to T11 to assure that the second arithmetic stage 56 picks up the data in the first arithmetic stage 27 before the data is reset. At T11, the third arithmetic stage 58 operates under waveforms A through T12. The third arithmetic stage 58 may operate between T11 to T12 to assure that the third arithmetic stage 58 will pick up the data from the second arithmetic stage 56 before the data is lost in the second arithmetic stage 56 caused by the reset signal at time A6 after T14. The first arithmetic stage 27 operates under waveforms B during T12 to T14, T16 to T18, T20 to T22, T24 to T26, T28 to T30, and T32 to T34. The first arithmetic stage 27 operates under waveforms A during T14 to 16, T18 to T20, T22 to T24, T26 to T28, and T30 to T32. The second arithmetic stage 56 operates under waveforms A during T14 to T15, T22 to T23, and T30 to T31. The second arithmetic stage 56 operates under waveforms B during T18 to T19, T26 to T27, and T34 to T35. The third arithmetic stage 58 operates under waveforms A during T27 to T28 and under waveforms B during T19 to T20 and T35 to T36.

The operation of the embodiment as shown in FIG. 3 under control of the waveforms shown in FIG. 6 which are applied to the various arithmetic stages as shown in FIG. 7 result in discrete analog output signals from the first, second and third arithmetic stages at particular times. In FIG. 8, various signals are shown as a function of time. The ordinate or each signal represents whether or not that signal occurs at a particular time and a letter is shown above each occurrence to identify the particular signal. The abscissa represents time from T1 through T44 and corresponds to the time T1 through T44 in FIG. 7. At the top of FIG. 8, an analog input signal from an analog signal source 14 varies between ±5 volts from T1 through T28. The analog input signal can be found on line 15 of the embodiment of FIG. 3 and represents the signal which is processed by the fast Fourier transform to determine its Fourier coefficients $F_0$ through $F_7$ for the signal between T1 and T12, and $F_0'$ through $F_7'$ for the analog input signal between time T12 and T28. The analog input signal on line 15 is quantized by a sample and hold circuit to provide a discrete analog data signal on line 17 of FIG. 3 which represents the analog input signal where a single voltage is used to represent the value of the analog input signal during a time increment such as T2−T1. The discrete analog data signal occurs for example, between T1 and T2 and is identified by $f_0$. The next discrete analog data signal on line 17 occurs between time T2 and T3 and is identified by $f_1$. The next discrete analog data signal occurs between time T3 and T4 and is identified as $f_2$. The discrete analog data signal occurring from T4 through T5 is identified as $f_3$, from T5 through T6 is identified as $f_4$, from T6 through T8 is identified as $f_5$, from T8 through T10 is identified as $f_6$, and from T10 through T12 is identified as $f_7$. The discrete analog data signals $f_0$ through $f_7$ represent eight data points of the analog input signal which is used in the fast Fourier transform for determining the Fourier coefficients $F_0$ through $F_7$.

The analog input signal is sampled again to form discrete analog data signals $f'_0$ through $f'_7$ to form eight more data points of the analog input signal which may subsequently be transformed by the fast Fourier transform to form the Fourier coefficients $F'_0$ through $F'_7$. $f'_0$ occurs at T12 through T14, $f'_1$ occurs at T14 through T16, $f'_2$ occurs at T16 through T18, $f'_3$ occurs at T18 through T20, $f'_4$ occurs between T20 and T22, $f'_5$ occurs between T22 and T24, $f'_6$ occurs between T24 and T26, and $f'_7$ occurs between T26 and T28.

The discrete analog data signal having a sequence from $f_0$ through $f_7$ is reordered by reorder loop 26 having an output on line 28 which is the reordered discrete analog data signal. The reordered discrete analog data signal is $f_0$, $f_4$, $f_2$, $f_6$, $f_1$, $f_5$, $f_3$ and $f_7$. $f'_0$ through $f'_7$ is reordered in the same manner to form a sequence of $f'_0$, $f'_4$, $f'_2$, $f'_6$, $f'_1$, $f'_5$, $f'_3$ and $f'_7$. The reordered discrete analog data signal $f_0$ occurs at T4 through T5, $f_4$ occurs between T5 and T6, $f_2$ occurs between T6 and T8, $f_6$ occurs between T8 and T10, $f_1$ occurs between T10 and T12, $f_5$ occurs between T12 and T14, $f_3$ occurs between T14 and T16, $f_7$ occurs between T16 and T18, $f'_0$ occurs between T18 and T20, $f'_4$ occurs between T20 and T22, $f'_2$ occurs between T22 and T24, $f'_6$ occurs between T24 and T26, $f'_1$ occurs between T26 and T28, $f'_5$ occurs between T28 and T30, $f'_3$ occurs between T30 and T32, and $f'_7$ occurs between T32 and T34.

The reordered discrete analog data signal on line 28 in FIG. 2 is presented to the first arithmetic stage 27. Between T4 and T5, $f_0$ is processed by the first arithmetic stage 27 under the control of waveforms A as shown in FIG. 7. During T5 through T6, $f_4$ is presented to the first arithmetic stage 27 which is under the control of waveforms B. The output of the first arithmetic stage identified as the first and second discrete analog output signals on lines 43 and 50, respectively occur at T6 through T7. The first discrete analog output signal is $X_0$ and the second discrete analog output signal is $X_4$ during the time T6 through T7. During T6 through T7 the second arithmetic stage 56 is operating under the control of waveforms A as shown in FIG. 7. The reordered discrete analog data signals $f_0$ and $f_4$ represent a predetermined pair of discrete analog data signals which are processed by the first arithmetic stage 27. The first discrete analog output signal on line 43 of FIG. 3 has additional signal outputs from subsequent processing of pairs of discrete analog data signals as follows: $X_1$ at T10 through T11, $X_2$ at T14 through T15, $X_3$ at T18 through T19, $X'_0$ at T22 through T23, $X'_1$ at T26 through T27, $X'_2$ at T30 through T31, and $X'_3$ at T34 through T35. The second discrete analog signal on line 50 of FIG. 3 has data outputs from subsequent processing of pairs of discrete analog data signals of $X_5$ at T10 through T11, $X_6$ at T14 through T15, $X_7$ at T18 through T19, $X'_4$ at T22 through T23, $X'_5$ at T26 through T27, $X'_6$ at T30 through T31, and $X'_7$ at T34 through T35. The output of the first arithmetic stage 27 is due to the processing of two input data points wherein the first is processed under control of waveforms A and the second is controlled under waveforms B.

The second arithmetic stage processes signals $X_0$ and $X_4$ in the second arithmetic stage from T6 to T7 under the control of waveforms A and processes signals $X_1$ and $X_5$ from T10 to T11 under the control of waveforms B to provide at T11 signals $Y_0$ on line 59, $Y_2$ on line 63, $Y_4$ on line 60, and $Y_6$ on line 64 which represent the third, fifth, fourth, and sixth discrete analog signals respectively. $Y_0$, $Y_2$, $Y_4$, and $Y_6$ are held as the output of the second arithmetic stage from T11 through T14 plus time A1 to A6 due to the operation of the reset signal at time A6 which occurs after T14. The third discrete analog output on line 59 in FIG. 3 has additional output signals of $Y_1$ at time T19 through T22 plus time A1 to A6, $Y'_0$ at time T27 through T30 plus time A1 to A6, and $Y'_1$ at time T35 through T38 plus time A1 to A6. The fifth discrete analog output signal on line 63 has $Y_3$ at time T19 through T22 plus time A1 to A6, $Y'_2$ at T27 through T30 plus time A1 to A6, and $Y'_3$ at time T35 through T38 plus time A1 to A6. The fourth discrete analog output signal on line 60 has $Y_5$ at time T19 through T22 plus time A1 to A6, $Y'_4$ at time T27 through T30 plus time A1 to A6, and $Y'_5$ at time T35 through T38 plus time A1 to A6. The sixth discrete analog output signal on line 64 has $Y_7$ at time T19 through T22 plus time A1 to A6, $Y'_6$ at T27 through T30 plus time A1 to A6, and $Y'_7$ at T35 through T38 plus time A1 to A6.

The third arithmetic stage 58 processes the input data at time T11 through T12 under waveforms A and T19 through T20 under waveforms B to generate signals $F_0$ through $F_7$ at time T20 to T27 plus time A1 to A6 which are the Fourier coefficients of an 8 point FFT of the analog input signal on line 15. Time A1 to A6 is the time for the Reset signal on the third stage under waveforms A. The third arithmetic stage 58 processes the input data at time T27 through T28 under waveforms A and T35 through T36 under waveforms B to provide $F'_0$ through $F'_7$ which are the Fourier coefficients of a second 8 point FFT, at time T36 through T43 plus time A1 to A6. The output of the third arithmetic stage 58 is the seventh through 14th discrete analog output signals, shown in FIG. 8, which are the Fourier coefficients $F_0$ through $F_7$ from time T20 through T27 plus time A1 to A6, and $F'_0$ through $F'_7$ from T36 through T43 plus Time A1 to A6.

An apparatus for realizing a fast Fourier transform of an analog input signal is described utilizing means for sampling the analog input signal to form a plurality of time spaced discrete analog data signals, means for reordering the discrete analog data signals to provide a sequence of predetermined pairs of discrete analog data signals, a first arithmetic stage including a charge coupled device for arithmetically combining the pairs of discrete analog data signals to form a first and second discrete analog output signal, a second arithmetic stage including a charge coupled device for arithmetically combining a pair of successive values of the first discrete analog output signal to form a third and fourth discrete analog output signal, means for weighting the second discrete analog output signal in accordance with predetermined values and a charge coupled device for arithmetically combining a pair of successive values of the weighted second discrete analog output signal to form a fifth and sixth discrete analog output signal, and a third arithmetic stage including a charge coupled device for arithmetically combining a pair of successive values of the third discrete analog output signal to form the seventh and eighth discrete analog output signal, means for weighting the fourth discrete analog output signal in accordance with predetermined values and charge a couple device for arithmetically combining a pair of successive values of the weighted fourth discrete analog output signal to form the ninth and tenth discrete analog output signals, means for weighting a fifth discrete analog output signal in accordance with predetermined values and a charge coupled device for arithmetically combining a pair of successive values of the weighted fifth discrete analog output signal to form the eleventh and twelfth discrete analog signal, and means for weighting the sixth discrete analog output signal in accordance with predetermined values and a charge coupled device for arithmetically combining a pair of successive values of the weighted sixth discrete analog output signal to form the thirteenth and fourteenth discrete analog output signal, the seventh through fourteenth discrete analog output signals having values indicative of the Fourier coefficients of the fast Fourier transform of the analog input signal.

In addition a circuit for performing analog arithmetic calculations for use in realizing a Fourier transform of an analog input signal is described utilizing an input for analog signals, means for multiplying the input analog signals by one of a plurality of a predetermined numbers to generate a first signal, a first charge coupled device coupled to the means for multiplying including a channel suitable for charge, means for injecting charge into said channel proportional to the first signal, means for isolating the charge in the channel from the means for injecting charge, means for collecting charge from the means for injecting charge and the means for isolating charge including means for generating a second signal proportional to the charge collected by the means for collecting charge, means for amplifying the second signal to maintain unity signal gain through the charge coupled device, means coupled to the first charge coupled device for removing charge collected by the means for collecting charge, a second charge coupled device coupled to the means for multiplying and coupled to the means for amplifying including a second channel suitable for charge, second means for injecting charge into the second channel proportional to the output of the means for amplifying, means for separating a portion of charge injected by the second means for injecting charge corresponding to the difference of the present first signal and the amplified second signal, second means for collecting the portion of charge from the means for separating including means for generating a third signal proportional to the charge collected by the second means for collecting charge, second means for amplifying the third signal to maintain unity gain through the second charge coupled device, and means coupled to the second charge coupled device for removing charge collected by the second means for collecting the portion of charge.

I claim as my invention:

1. Apparatus for realizing a fast Fourier transform of an analog input signal represented by a plurality of time spaced discrete analog data signals each having a single value comprising:

means for reordering said discrete analog data signals to provide a sequence of predetermined pairs of said discrete analog data signals, a first arithmetic stage including a charge coupled device for arithmetically combining said pairs of said discrete analog data signals to form a first and second discrete analog output signal, a second arithmetic stage including a charge coupled device for arithmetically combining a pair of successive values of said first discrete analog output signal to form a third and fourth discrete analog output signal, means for weighting said second discrete analog output signal in accordance with predetermined values and a charge coupled device for arithmetically combining a pair of succesive values of said weighted second discrete analog output signal to form a fifth and sixth discrete analog output signal, and a third arithmetic stage including a charge coupled device for arithmetically combining a pair of successive values of said third discrete analog output signal to form the seventh and eighth discrete analog output signal, means for weighting said fourth discrete analog output signal in accordance with predetermined values and a charge coupled device for arithmetically combining a pair of successive values of said weighted fourth discrete analog output signal to form the ninth and tenth discrete analog output signal, means for weighting said fifth discrete analog output signal in accordance with predetermined values and a charge coupled device for arithmetically combining a pair of successive values of said weighted fifth discrete analog output signal to form the eleventh and twelfth discrete analog output signal, and means for weighting said sixth discrete analog output signal in accordance with predetermined values and a charge coupled device for arithmetically combining a pair of successive values of said weighted sixth discrete analog output signal to form the thirteenth and fourteenth discrete analog output signal, said seventh through fourteenth discrete analog output signals having values indicative of the Fourier coefficients of the fast Fourier transform of said analog input signal.

2. The apparatus of claim 1 wherein said first arithmetic stage includes a first analog adder and a first analog subtractor.

3. The apparatus of claim 2 wherein said first analog adder includes a first amplifier to provide constant gain through said first adder and said first analog subtractor includes a second amplifier to provide constant gain through said subtractor.

4. The apparatus of claim 3 wherein said first analog subtractor has a first input coupled to an input of said first analog adder and a second input coupled to an output of said first analog adder.

5. The apparatus of claim 1 wherein said second arithmetic stage includes a first analog adder and a first analog subtractor.

6. The apparatus of claim 1 wherein said third arithmetic stage includes a first analog adder and a first analog subtractor.

7. The apparatus of claim 1 further including means for timing to provide timing signals coupled to said means for reordering, said first arithmetic stage, said second arithmetic stage and said third arithmetic stage for controlling the flow of data through said apparatus.

8. Apparatus for realizing a fast Fourier transform of an analog input signal represented by a plurality of time spaced discrete analog data signals each having a single value comprising:

- means for reordering said discrete analog data signals to provide a sequence of predetermined pairs of said discrete analog data signals,
- a first arithmetic stage including a first channel for adding together the values in said pairs of said discrete analog data signals and a second channel for subtracting, one value from another, said pairs of said discrete analog data signals,
- first means for storage coupled to said first arithmetic stage for storing a predetermined number of discrete analog data signals from at least one of said first and second channels,
- first means for multiplexing coupled to said first means for storage and said first arithmetic stage for transferring a predetermined order of discrete analog data signals from said first and second channels,
- a second arithmetic stage coupled to said first means for multiplexing including means for weighting a predetermined number of discrete analog data signals from at least one of said first and second channels, a third channel for adding together pairs of successive values from said first channel and pairs of successive values from said second channel and a fourth channel for subtracting, one value from another, pairs of successive values from said first channel and pairs of successive values from said second channel,
- second means for storage coupled to said second arithmetic stage for storing a predetermined number of discrete analog data signals from at least one of said third and fourth channels,
- second means for multiplexing coupled to said second means for storage and said second arithmetic stage for transferring a predetermined order of discrete analog data signals from said third and fourth channels,
- a third arithmetic stage coupled to said second means for multiplexing, including means for weighting a predetermined number of discrete analog data signals by a plurality of predetermined weights, a fifth channel for adding together pairs of successive values of discrete analog data signals from said means for multiplexing, a sixth channel for subtracting, one value from another, pairs of successive values of discrete analog data signals, the output of said fifth and sixth channel containing the Fourier coefficients of the analog input signal.

9. The apparatus of claim 8 wherein at least one of said first, third and fifth channels include a charge coupled device.

10. The apparatus of claim 8 wherein at least one of said second, fourth and sixth channels includes a charge coupled device.

11. The apparatus of claim 8 wherein at least one of said first and second means for storage includes a charge coupled device.

12. The apparatus of claim 9 wherein said charge coupled device includes means for storing the first values of said pairs of successive values prior to its addition to the second value of said pairs of successive values.

13. The apparatus of claim 9 wherein said first, third, and fifth channel includes means for providing unity analog signal gain through said channel.

14. A circuit for performing analog arithmetic calculations for use in realizing a fast Fourier transform of an analog input signal comprising:

- an input for analog signals,
- means for multiplying said input analog signals by one of a plurality of a predetermined numbers to generate a first signal,
- first means for biasing at predetermined times said first signal,
- a first charge coupled device coupled to said means for multiplying including
  - a first device channel suitable for charge,
  - first means for injecting charge into said first device channel proportional to said first signal,
  - means for isolating at predetermined times the charge in said first device channel from said means for injecting charge,
  - first means for collecting charge from said means for injecting charge and said means for isolating charge including means for generating a second signal proportional to the charge collected by said first means for collecting charge, first means for amplifying said second signal to maintain unity signal gain through said first charge coupled device, first means coupled to said first charge coupled device for removing at predetermined times charge collected by said means for collecting charge,
- second means for biasing at predetermined times said amplified second signal,
- a second charge coupled device coupled to said means for multiplying and coupled to said first means for amplifying including
  - a second device channel suitable for charge,
  - second means for injecting charge into said second device channel proportional to the amplified second signal,
  - means for separating a portion of charge injected by said second means for injecting charge corresponding to the difference of the present first signal and the amplified second signal,
  - second means for collecting said portion of charge from said means for separating including means for generating a third signal proportional to the charge collected by said second means for collecting charge,
  - second means for amplifying said third signal to maintain unity gain through said second charge coupled device, and means coupled to said second charge coupled device for removing charge collected by said second means for collecting said portion of charge.

15. The circuit of claim 14 wherein said first means for injecting charge includes a diffusion, said first device channel terminating at said diffusion, an electrical insulation layer over said first device channel and a portion of said diffusion, a first electrode located on said insulation layer over said first device channel, a second electrode located on said insulation layer over said first device channel, and said first electrode positioned between said diffusion and said second electrode for controlling the movement of charge from said diffusion to said channel below said second electrode and from below said second electrode to said diffusion.

16. The circuit of claim 14 wherein said means for separating includes an electrical insulation layer over said second device channel, a first, second and third electrode located on said insulation layer over said second device channel, said second electrode positioned between said first and third electrode, said channel in the region below said first electrode containing charge injected by said second means for injecting, said channel in the region below said third electrode being attractive to charge caused by the potential of said third electrode, and said second electrode controlling the movement of a quantity of charge in said channel in response to the potential of said second electrode from underneath said first electrode to underneath said third electrode.

* * * * *